United States Patent
George et al.

(10) Patent No.: US 10,208,383 B2
(45) Date of Patent: Feb. 19, 2019

(54) ATOMIC LAYER ETCHING PROCESSES USING SEQUENTIAL, SELF-LIMITING THERMAL REACTIONS COMPRISING OXIDATION AND FLUORINATION

(71) Applicant: THE REGENTS OF THE UNIVERSITY OF COLORADO, A BODY CORPORATE, Denver, CO (US)

(72) Inventors: Steven M. George, Boulder, CO (US); Younghee Lee, Boulder, CO (US); Nicholas Johnson, Louisville, CO (US)

(73) Assignee: The Regents of the University of Colorado, a body corporate, Denver, CO (US)

( * ) Notice: Subject to any disclaimer, the term of this patent is extended or adjusted under 35 U.S.C. 154(b) by 0 days.

(21) Appl. No.: 15/893,054

(22) Filed: Feb. 9, 2018

(65) Prior Publication Data

US 2018/0223437 A1    Aug. 9, 2018

Related U.S. Application Data

(60) Provisional application No. 62/456,944, filed on Feb. 9, 2017.

(51) Int. Cl.
| | | |
|---|---|---|
| *C23F 4/00* | (2006.01) | |
| *C09K 13/10* | (2006.01) | |
| *C09K 13/00* | (2006.01) | |
| *C09K 13/08* | (2006.01) | |

(52) U.S. Cl.
CPC ............... *C23F 4/00* (2013.01); *C09K 13/00* (2013.01); *C09K 13/08* (2013.01); *C09K 13/10* (2013.01)

(58) Field of Classification Search
CPC ........................................................ C23F 4/00
USPC ............................................................ 216/38
See application file for complete search history.

(56) References Cited

U.S. PATENT DOCUMENTS

| | | |
|---|---|---|
| 5,368,687 A | 11/1994 | Sandhu et al. |
| 5,389,196 A | 2/1995 | Bloomstein et al. |
| 5,705,443 A | 1/1998 | Stauf et al. |
| 5,814,238 A | 9/1998 | Ashby et al. |
| 6,010,966 A | 1/2000 | Ionov |
| 6,690,014 B1 | 2/2004 | Gooch et al. |

(Continued)

FOREIGN PATENT DOCUMENTS

| | | |
|---|---|---|
| WO | 2017205658 A1 | 11/2017 |
| WO | 2017213842 A2 | 12/2017 |

OTHER PUBLICATIONS

Kanarik, et al., Overview of Atomic Layer Etching in the Semiconductor Industry, J Vac Sci Technol A, vol. 33 (2) , 2015, pp. 1-14.

(Continued)

*Primary Examiner* — Roberts P Culbert
(74) *Attorney, Agent, or Firm* — Saul Ewing Arnstein & Lehr LLP; Kathryn Doyle; Domingos J. Silva

(57) ABSTRACT

The invention includes a method of promoting atomic layer etching (ALE) of a surface. In certain embodiments, the method comprises contacting a solid substrate comprising a first metal compound with an oxidant, optionally contacting the solid substrate with a second metal compound, and then contacting the modified solid substrate with a fluorinating agent, whereby ALE of the solid substrate is promoted.

24 Claims, 18 Drawing Sheets

(56) References Cited

U.S. PATENT DOCUMENTS

| | | | |
|---|---|---|---|
| 7,357,138 | B2 | 4/2008 | Ji et al. |
| 7,416,989 | B1 | 8/2008 | Liu et al. |
| 7,781,340 | B2 | 8/2010 | Chen et al. |
| 2006/0003145 | A1 | 1/2006 | Hansen et al. |
| 2006/0292877 | A1 | 12/2006 | Lake et al. |
| 2008/0023800 | A1 | 1/2008 | Holzig et al. |
| 2010/0099264 | A1 | 4/2010 | Elers et al. |
| 2011/0027999 | A1* | 2/2011 | Sparks .................. C23F 4/00 438/712 |
| 2014/0273492 | A1 | 9/2014 | Anthis et al. |
| 2015/0162214 | A1 | 6/2015 | Martin et al. |
| 2015/0270140 | A1 | 9/2015 | Jurcik et al. |
| 2016/0111294 | A1 | 4/2016 | Lill et al. |
| 2017/0018439 | A1 | 1/2017 | Wang et al. |
| 2017/0365478 | A1 | 12/2017 | George et al. |

OTHER PUBLICATIONS

Lee, et al., Atomic Layer Etching of Al2O3 Using Sequential, Self-Limiting Thermal Reactions with Sn(acac)2 and Hydrogen Fluoride, ACS Nano, vol. 9, No. 2, 2015, pp. 2061-2070.

Yang, X. et al., Drying Etching of Al2O3 Thin Films in O2/BCl3/Ar Inductively Coupled Plasma, Transactions on Electrical and Electronic Materials, vol. 11, No. 5, 2010, pp. 202-205.

\* cited by examiner

Oxidation of
Ti³⁺ to Ti⁴⁺

Volatile TiF₄
Formation

ATOMIC LAYER ETCHING PROCESSES USING SEQUENTIAL, SELF-LIMITING THERMAL REACTIONS COMPRISING OXIDATION AND FLUORINATION

CROSS-REFERENCE TO RELATED APPLICATIONS

The present application claims priority under 35 U.S.C. § 119(e) to U.S. Provisional Patent Application No. 62/456,944, filed Feb. 9, 2017, which is incorporated herein by reference in its entirety.

BACKGROUND OF THE INVENTION

The continued miniaturization of advanced semiconductor devices requires atomic layer control in both growth and etching processes. Atomic layer deposition (ALD) and atomic layer etching (ALE) techniques can provide the necessary atomic level precision. ALD techniques have been developed for a wide range of materials over the past few decades, and have been extensively adapted by the semiconductor industry. In contrast, the need for ALE techniques has emerged more recently, and ALE methods are still in an early stage of development.

Initial plasma ALE methods have been based on surface activation by halogenation, followed by ion bombardment to remove surface material. Plasma processes have been developed for a variety of materials including Si, compound semiconductors, metal oxides, and carbon materials. The plasma ALE method can further achieve anisotropic etching.

Thermal ALE techniques have also been demonstrated with fluorination and ligand-exchange reactions. Thermal ALE methods have been developed for $Al_2O_3$, $HfO_2$, $ZrO_2$, AlN and $AlF_3$. Thermal ALE is capable of providing isotropic etching. In contrast, materials with volatile metal fluorides do not have thermal ALE pathways using fluorination and ligand-exchange reactions because their fluorides are gases. Other materials, such as elemental metals, may fluorinate readily and produce fluoride layers that are too thick for ALE. For these materials, alternative pathways are required for controlled ALE.

There remains a need in the art for methods that allow for ALE to be used in materials resistant to known plasma ALE and thermal ALE techniques. The present invention addresses and meets this need.

BRIEF SUMMARY OF THE INVENTION

In one aspect, the invention provides a method of promoting atomic layer etching (ALE) on a solid substrate comprising a first metal compound.

In certain embodiments, the method comprises contacting at least a portion of the surface of the solid substrate with an oxidant, whereby a first metal oxide is formed on the portion of surface of the solid substrate contacted with the oxidant. In other embodiments, the method comprises contacting at least a portion of the surface of the first metal oxide with a fluorinating agent, whereby a volatile metal fluoride is formed; whereby ALE of the solid substrate is promoted.

In certain embodiments, the method comprises contacting at least a portion of the surface of the solid substrate with an oxidant, whereby a first metal oxide is formed on the portion of surface of the solid substrate contacted with the oxidant. In other embodiments, the method comprises contacting at least a portion of the surface of the first metal oxide with a second metal compound, whereby a second metal oxide is formed on the portion of surface of the first metal oxide contacted with the second metal compound and whereby a volatile first metal species is further formed. In yet other embodiments, the method comprises contacting at least a portion of the surface of the second metal oxide with a fluorinating agent, whereby a volatile metal fluoride is formed; whereby ALE of the solid substrate is promoted.

In certain embodiments, the sequential steps of the method are repeated one or more times, wherein each repetition of the sequential steps etches the solid substrate at a rate of about 0.1 Å to about 3.0 Å per cycle of sequential steps.

In certain embodiments, the first metal compound comprises at least one selected from the group consisting of a metal-Group III, metal-Group IV, metal-Group V, metal-Group VI, elemental metal, metal alloy, hybrid organic-inorganic material, and any combinations of thereof. In other embodiments, the first metal compound comprises at least one selected from the group consisting of metal boride, metal carbide, metal silicide, metal germanide, metal nitride, metal phosphide, metal arsenide, metal antimonide, metal sulfide, metal selenide, metal telluride, an elemental metal, metal alloy, hybrid organic-inorganic material, and any combinations thereof.

In certain embodiments, the first metal compound is capable of forming a volatile metal fluoride. In other embodiments, the first metal fluoride has a melting point of less than 200° C. at 1 atm pressure. In other embodiments, the first metal compound comprises a species selected from the group consisting of Ti, Ta, Nb, V, W, Mo, Ir, Ru, Rh, Re, Au, Cr, Pt, B, Si, Ge, As, Sb, and Te.

In certain embodiments, the second metal compound comprises a metal species capable of forming a stable metal oxide species on the surface of the first metal oxide. In other embodiments, the first metal oxide comprises a metal species capable of forming at least one first metal species selected from the group consisting of a volatile metal oxyfluoride, a volatile metal chloride, a volatile metal oxychloride, a volatile metal bromide, a volatile oxybromide, a volatile metal iodide, a volatile oxyiodide, and a volatile metal organic compound. In certain embodiments, the first metal species has a melting point of less than 200° C. at 1 atm pressure.

In other embodiments, the second metal compound comprises a metal species capable of forming at least one second metal species selected from the group consisting of a volatile metal fluoride, volatile metal oxyfluoride, volatile metal chloride, volatile metal oxychloride, volatile metal bromide, volatile metal oxybromide, volatile metal iodide, and volatile metal oxyiodide. In certain embodiments, the second metal species has a melting point of less than 200° C. at 1 atm pressure.

In yet other embodiments, first metal compound comprises a species selected from the group consisting of Al, Hf, Zr, Fe, Ni, Co, Mn, Mg, Rh, Ga, In, Zn, Pb, Cu, Cd, Hg, Ca, Li, Ag, Sn, Y, Ti, Ta, Nb, V, W, Mo, Ir, Ru, Rh, Re, Au, Cr, Pt, B, Si, Ge, As, Sb, and Te. In yet other embodiments, the second metal compound is at least one selected from $BCl_3$, $B(CH_3)_3$, $BBr_3$, $BI_3$, and $TiCl_4$. In other embodiments, the second metal oxide is $B_2O_3$ or $TiO_2$.

In certain embodiments, the oxidant is a gaseous oxidant selected from the group consisting of $O_2$, $H_2O_2$, $O_3$, oxygen plasma, reactive oxygen radical species, $NO_2$ plasma, $N_2O$ plasma, NO plasma, $HNO_3$ plasma and $SO_2$ plasma.

In certain embodiments, the fluorinating agent is a gaseous fluorinating agent selected from the group consisting of HF, $SF_4$, $XeF_2$, $F_2$, and $SF_6$ plasma.

In certain embodiments, the method is used for at least one process selected from patterning a surface of the substrate, cleaning a surface of the substrate, creating pores in a surface of the substrate, enlarging pores in a porous surface of the substrate, smoothing a surface of the substrate, removing defects from a surface of the substrate, removing damaged surface layers of the substrate and removing unwanted clusters or islands from a surface of the substrate.

In certain embodiments, the method is used to produce a substrate film having a thickness of less than about 10 nm by first depositing a film having a thickness greater than about 10 nm and then etching the film by performing the sequential steps of the method one or more times.

In certain embodiments, the solid substrate is formed using atomic layer deposition (ALD).

BRIEF DESCRIPTION OF THE FIGURES

For the purpose of illustrating the invention, depicted in the drawings are certain embodiments of the invention. However, the invention is not limited to the precise arrangements and instrumentalities of the embodiments depicted in the drawings.

FIG. 15A is a graph showing $WO_3$ etch rate as $BCl_3$ exposure was varied with HF exposure held at 200 mTorr s. FIG. 15B is a graph showing $WO_3$ etch rate as HF exposure was varied with $BCl_3$ exposure held at 327 mTorr s.

FIG. 21A shows $WO_3$ thickness showing oscillation of $WO_3$ thickness after $O_2/O_3$ exposure and $BCl_3$/HF reaction. FIG. 21B shows W thickness showing linear reduction vs. number of half-cycles with an etch rate of 2.44 Å/cycle.

FIG. 24A is a graph showing W etch rate as $BCl_3$ exposure was varied with HF and $O_2/O_3$ exposures held at 2800 and 3150 mTorr s, respectively. FIG. 24B is a graph showing W etch rate as HF exposure was varied with $BCl_3$ and $O_2/O_3$ exposures held at 500 and 3150 mTorr s, respectively.

FIG. 26A shows $WO_3$ thickness vs. number of cycles showing reduction of $WO_3$ thickness to limiting value of ~3 Å. FIG. 26B shows W thickness vs. number of cycles showing that W thickness remains nearly constant during $WO_3$ removal.

DETAILED DESCRIPTION OF THE INVENTION

Figure 1A:
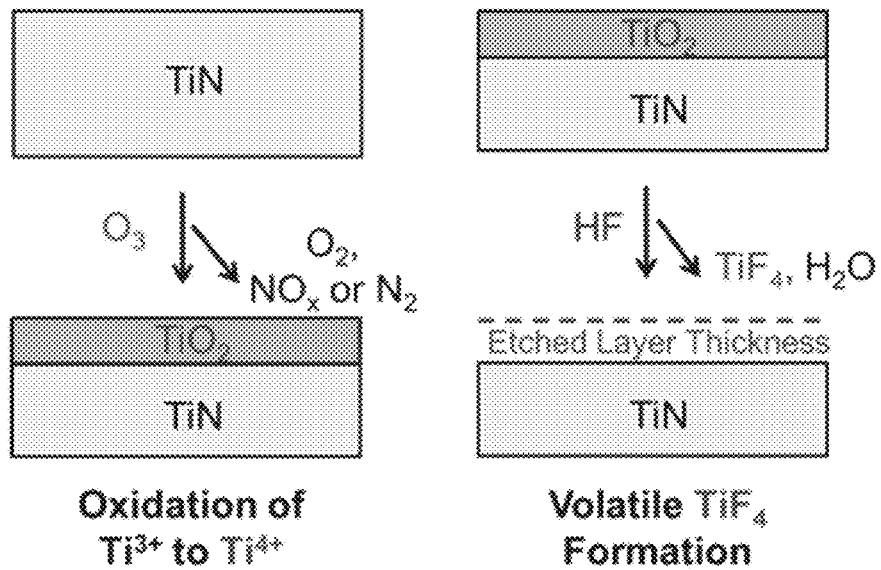
FIG. 1A is a schematic for TiN ALE using $O_3$ and HF as the reactants according to an exemplary embodiment of the invention. $O_3$ oxidizes the TiN substrate to form a $TiO_2$ layer on the surface. Subsequently, HF removes the $TiO_2$ layer by forming volatile $TiF_4$ and $H_2O$ reaction products.

The present invention relates to the unexpected discovery of novel methods of promoting and/or enhancing atomic layer etching (ALE) of a metal-containing surface using sequential, self-limiting thermal reactions. In certain embodiments, the metal surface is contacted with an oxidant, thereby forming a metal oxide species, which is optionally contacted with a conversion reactant, thereby forming a conversion oxide species. The modified surface is then contacted with a fluorinating agent, thereby forming a volatile fluoride species that can be removed from the surface through ALE.

Disclosure

Thermal ALE Based on Oxidation & Fluorination Reactions

Many materials are not easily etched using sequential fluorination and ligand-exchange reactions. For example, TiN was not etched by sequential exposures of HF and various metal precursors such as $Sn(acac)_2$, $Al(CH_3)_3$, $AlCl(CH_3)_2$ or $SiCl_4$. Either the TiN is not fluorinated by HF or the ligand-exchange reactions with the metal precursors do not produce stable and volatile reaction products. However, alternative chemical strategies can be employed for TiN ALE.

New TiN ALE chemistry can be defined using oxidation and fluorination reactions. For example, the surface of TiN can be converted to a $TiO_2$ surface layer by an oxidation reaction with either $H_2O_2$ or $O_3$ according to:

$$TiN + 3H_2O_2 \rightarrow TiO_2 + NO + 3H_2O \quad (1)$$

—or—

$$TiN + 3O_3 \rightarrow TiO_2 + NO + 3O_2 \quad (2)$$

These reactions are thermochemically favorable and are predicted to be spontaneous based on their negative $\Delta G$ values. The $H_2O_2$ reaction given by Equation 1 has a predicted Gibbs Free energy change of $\Delta G = -212$ kcal/mole at 250° C. The $O_3$ reaction given by Equation 2 has a predicted Gibbs Free energy change of $\Delta G = -242$ kcal/mole at 250° C.

These oxidation reactions form a self-passivating oxide layer on the nitride substrate. The oxide layer is self-passivating because the oxide layer serves as a diffusion barrier to subsequent oxidation. In addition, the oxide layer is also self-passivating because the oxide layer has a Pilling-Bedworth ratio >1. For TiN oxidizing to $TiO_2$, the Pilling-Bedworth ratio is 1.65 The metal oxide expands relative to the metal nitride and forms a continuous metal oxide film on the metal nitride. There also may be compressive stress in the metal oxide film that inhibits further oxidation.

Following the conversion of TiN to $TiO_2$, the $TiO_2$ can then be etched by a fluorination reaction with HF according to:

$$TiO_2 + 4HF \rightarrow TiF_4 + 2H_2O \quad (3)$$

Note that this reaction has a small positive Gibbs Free energy change of $\Delta G = +6.3$ kcal/mole at 250° C. However, the reaction is known to occur as shown in Example 1. Thermochemical calculations are not always accurate predictors of a reaction when the $\Delta G$ value is small. Reactions are not usually run under equilibrium conditions. The volatile products of a reaction are allowed to escape under vacuum conditions. In addition, the surface reaction products may not have heats of formation that are the same as bulk species.

After removing the $TiO_2$ layer, the underlying TiN is not spontaneously etched by HF. Instead, the TiN is believed to be fluorinated according to:

$$TiN + 3HF \rightarrow TiF_3 + NH_3 \quad (4)$$

This reaction has a predicted Gibbs Free energy change of $\Delta G = -37$ kcal/mole at 250° C. The formation of a passivating $TiF_3$ layer acts as a barrier to further fluorination.

The above reactions demonstrate that TiN ALE can be performed using sequential oxidation and fluorination reactions. In this thermal ALE process, the fluorination reaction in Equation 3 is responsible for etching because $TiF_4$ is volatile. In contrast, the previous thermal ALE processes based on fluorination and ligand-exchange reactions required a stable metal fluoride to be formed during the fluorination reaction. The metal fluoride was then removed by the ligand-exchange reaction.

Other metal nitrides could be etched using a similar procedure. Examples of these metal nitrides include TaN, NbN and BN. These metal nitrides all have volatile metal fluorides. These metal nitrides would not be expected to have a self-limiting fluorination reaction using the earlier thermal ALE procedure based on fluorination and ligand-exchange. However, using the new strategy based on oxidation and fluorination reactions, a self-limiting oxidation can first convert the metal nitride to the self-passivating metal oxide. Then HF can remove the metal oxide by spontaneous etching of the metal oxide because the metal fluoride is volatile.

The oxidation and fluorination reactions for TaN ALE are given below. $O_3$ is used as the oxidation reagent.

$$TaN + 7/2 O_3 \rightarrow \tfrac{1}{2} Ta_2O_5 + NO + 7/2 O_2 \quad (5)$$

$$\tfrac{1}{2} Ta_2O_5 + 5HF \rightarrow TaF_5(g) + 5/2 H_2O \quad (6)$$

Likewise, the oxidation and fluorination reactions for BN ALE are shown below. $O_3$ is again used as the oxidation reagent.

$$BN + 5/2 O_3 \rightarrow \tfrac{1}{2} B_2O_3 + 5/2 O_2 + NO \quad (7)$$

$$\tfrac{1}{2} B_2O_3 + 3HF \rightarrow BF_3 + 3/2 H_2O \quad (8)$$

For TaN and BN ALE, the oxidation reaction again converts the metal nitride to the self-passivating metal oxide. The oxide layer is self-passivating because the oxide layer serves as a diffusion barrier to subsequent oxidation. In addition, the oxide layer is also self-passivating because the oxide layer has a Pilling-Bedworth ratio >1. For TaN oxidized to $Ta_2O_5$, the Pilling-Bedworth ratio is 1.89. For BN oxidized to $B_2O_3$, the Pilling-Bedworth ratio is 1.19. The metal oxide expands relative to the metal nitride and forms a continuous metal oxide film on the metal nitride. There also may be compressive stress in the metal oxide film that acts to inhibit further oxidation.

In addition, the oxidation reaction can change the oxidation state of the metal in the metal nitride. The oxidation of TiN to $TiO_2$ changes the oxidation state of Ti from 3+ to 4+. The oxidation of TaN to $Ta_2O_5$ changes the oxidation state of Ta from 3+ to 5+. These changes in oxidation state are important to establish the correct oxidation state for the volatile metal fluoride produced by the HF reaction. The oxidation state of Ti in $TiF_4$ is 4+. The oxidation state of Ta in $TaF_5$ is 5+. This change is oxidation state is important to produce a volatile fluoride from the metal oxide. Without intending to be limited to any particular theory, it is believed that fluorination of the metal oxide does not involve a change in the oxidation state.

The oxidation of BN to $B_2O_3$ does not change the oxidation state of B. The oxidation state of B in both BN and $B_2O_3$ is 3+. A change in oxidation state is not necessary because the oxidation state of the volatile $BF_3$ reaction product is also 3+. However, this lack of change in the oxidation state also may lead to the spontaneous etching of BN by HF. The BN underlying the $B_2O_3$ may not act as an etch stop during the HF exposure. In non-limiting embodiments, a change in oxidation state during the oxidation reaction to the oxidation state of the volatile fluoride yields an effective ALE process.

The methods can be further expanded to additional materials, as discussed in Example 4.

Thermal ALE Based on Oxidation, Conversion & Fluorination Reactions

Many metal oxides do not yield a volatile metal fluoride upon reaction with HF. However, some of these metal oxides can first be converted to an alternative metal oxide. The alternative metal oxide then may display a volatile metal fluoride upon reaction with HF.

In addition, some elemental metals do not form a stable metal fluoride because the metal fluoride is highly volatile. To avoid the spontaneous etching of the elemental metal during fluorination, some elemental metals can first be oxidized to the metal oxide. The metal oxide can then be etched with atomic layer control using fluorination and ligand-exchange reactions.

Alternatively, if the metal oxide does not undergo ALE by fluorination and ligand-exchange reactions, the metal oxide may be first converted to an alternative metal oxide. This alternative metal oxide may then undergo ALE by fluorination and ligand-exchange reactions or may display a volatile metal fluoride upon reaction with HF.

The introduction of the conversion reaction sidesteps problems that can prevent the definition of effective ALE procedures. The conversion reaction can convert the initial material to an alternative material that avoids the problems. The introduction of the conversion reaction can lead to a three-step etch sequence for ALE based on oxidation, conversion and fluorination reactions.

W ALE is a model system for thermal ALE of an elemental metal based on oxidation, conversion and fluorination reactions. Tungsten (W) has a very volatile fluoride, $WF_6$. Fluorination with various fluorination precursors does not lead to a self-limiting metal fluoride. Instead, fluorination with fluorination precursors, such as $XeF_2$, leads to a volatile $WF_6$ reaction product and spontaneous etching.

To avoid this spontaneous etching, W can first be oxidized to $WO_3$ using $O_3$ or an $O_2$ plasma:

$$W + 3O_3(g) \rightarrow WO_3 + 3O_2(g) \quad (9)$$

This reaction with $O_3$ is thermochemically favorable with a predicted Gibbs Free energy change of $\Delta G = -211$ kcal/mole at 250° C. The oxidation reaction forms a self-passivating oxide layer on the W substrate. The oxide layer is self-passivating because the oxide layer serves as a diffusion barrier to subsequent oxidation. In addition, the oxide layer is also self-passivating because the oxide layer has a Pilling-Bedworth ratio >1. For W oxidizing to $WO_3$, the Pilling-Bedworth ratio is 3.39. The $WO_3$ expands relative to the tungsten metal and forms a continuous $WO_3$ film. There also may be compressive stress in the $WO_3$ film that inhibits further oxidation.

$WO_3$ can then lead to etching pathways. However, exposure of $WO_3$ to HF does not form volatile $WF_6$ based on the reaction:

$$WO_3 + 6HF \rightarrow WF_6 + 3H_2O \quad (10)$$

This reaction is not thermochemically favorable because the predicted Gibbs Free energy change is $\Delta G = +35$ kcal/mole at 250° C. Although $WO_3$ does not produce volatile products during HF exposures, other oxides may lead to volatile products. If $WO_3$ can be converted to these other oxides, then etching pathways may be possible.

Fortunately, $WO_3$ can be converted to another metal oxide. Following W oxidation to $WO_3$, the $WO_3$ can be converted to $B_2O_3$. This conversion reaction can occur by reaction with $BCl_3$:

$$WO_3 + 2BCl_3 \rightarrow B_2O_3 + WCl_6 \quad (11)$$

This reaction is thermochemically favorable with a predicted Gibbs Free energy change of $\Delta G = -6$ kcal/mole at 250° C.

After the conversion of $WO_3$ to $B_2O_3$ using $BCl_3$, $B_2O_3$ can be etched with HF according to the reaction:

$$B_2O_3 + 6HF \rightarrow 2BF_3(g) + 3H_2O \quad (12)$$

This reaction is favorable as demonstrated in Example 2. The predicted Gibbs Free energy change is $\Delta G = -17$ kcal/mole at 250° C. The conversion of $WO_3$ to $B_2O_3$ by reaction with $BCl_3$ is necessary to produce a volatile $BF_3$ product in the reaction given by Equation 12.

The conversion of various metal oxides to $B_2O_3$ can occur if $B_2O_3$ is more stable than the initial metal oxide. This conversion pathway to $B_2O_3$ will be important for a variety of metal oxides that do not have effective ALE pathways. There may be no ALE pathways because the metal oxide may etch spontaneously with no atomic layer control upon exposure to HF. Another possibility that would prevent ALE is that the metal oxide may form a metal fluoride that may not undergo a facile ligand-exchange reaction. The conversion to $B_2O_3$ may solve either of these two difficulties.

The conversion of metal oxides to $B_2O_3$ may provide a pathway to ALE for various other metal oxides. For example, possible conversion reactions with $BCl_3$ at 200° C. for a variety of metal oxides are given below:

| | $\Delta G$ (kcal at 200° C.) |
|---|---|
| $3WO_3 + 2BCl_3(g) \rightarrow B_2O_3 + 3WO_2Cl_2(g)$ | $-23$ |
| $3MoO_3 + 2BCl_3(g) \rightarrow B_2O_3 + 3MoO_2Cl_2(g)$ | $-60$ |
| $3CrO_3 + 2BCl_3(g) \rightarrow B_2O_3 + 3CrO_2Cl_2(g)$ | $-96$ |
| $1.5GeO_2 + 2BCl_3(g) \rightarrow B_2O_3 + 1.5GeCl_4(g)$ | $-76$ |
| $1.5SnO_2 + 2BCl_3(g) \rightarrow B_2O_3 + 1.5SnCl_4(g)$ | $-71$ |

These reactions all have negative $\Delta G$ values at 200° C. These negative $\Delta G$ values indicate that these reactions are all predicted to be spontaneous.

The thermal ALE process based on oxidation, conversion and fluorination reactions is general. This procedure may apply for the ALE of elemental metals and metal compounds with volatile fluorides that cannot be etched with atomic layer control using fluorination and ligand-exchange reactions because the fluorination reaction is spontaneous. In addition, the fluorination reaction is very robust for elemental metals. Even for elemental metals with stable, non-volatile fluorides, initial oxidation of the elemental metals may be desirable to prevent the large heats of fluorination from leading to thick fluoride layers.

A variety of elemental metals could be etched with atomic layer control using oxidation, conversion and fluorination reactions including Mo, Ir, Re, Ru, Ta and Nb. These metals all have volatile fluorides and would not display self-limiting fluorination reactions. Fortunately, these metals can first be oxidized and then converted to $B_2O_3$. For example, elemental Mo can be oxidized using ozone according to:

$$Mo + O_3 \rightarrow MoO_3 \quad (13)$$

This reaction is predicted to be spontaneous based on a predicted Gibbs Free energy change of ΔG=−188 kcal/mole at 250° C. MoO$_3$ can then be converted to B$_2$O$_3$ by reaction with BCl$_3$ according to:

$$MoO_3 + 2BCl_3 \rightarrow B_2O_3 + MoCl_6 \qquad (14)$$

This reaction is predicted to be spontaneous based on a predicted Gibbs Free energy change of ΔG=−16 kcal/mole at 250° C. Subsequently, B$_2$O$_3$ could be removed with HF according to Equation 12.

A variety of metal nitrides could also be etched using oxidation, conversion and fluorination reactions including WN, MoN, TaN, NbN. These metal nitrides all have volatile fluorides and may not display self-limiting fluorination reactions. For example, WN could first be oxidized using ozone according to:

$$WN + 4/3 O_3 \rightarrow WO_3 + NO \qquad (15)$$

This reaction is predicted to be spontaneous based on a predicted Gibbs Free energy change of ΔG=−390 kcal/mole at 250° C. WO$_3$ could then be converted to B$_2$O$_3$ by reaction with BCl$_3$ according to Equation 11. Subsequently, B$_2$O$_3$ could be removed with HF according to Equation 12.

Thermal ALE based on oxidation, conversion and fluorination reactions could also be employed for metal sulfides and metal selenides of metals that have volatile fluorides. For example, MoS$_2$, WS$_2$, MoSe$_2$ and WSe$_2$ are metal sulfides and metal selenides composed of metals, Mo and W, that have volatile fluorides. These metal sulfides and metal selenides are also important two-dimensional (2D) materials.

These metal sulfides and metal selenides could be etched with atomic layer control using oxidation, conversion and fluorination reactions. For example, WS$_2$ could first be oxidized using ozone according to:

$$WS_2 + 3O_3 \rightarrow WO_3 + 2SO_3 \qquad (16)$$

This reaction is predicted to be spontaneous based on a predicted Gibbs Free energy change of ΔG=−406 kcal/mole. Subsequently, WO$_3$ could be converted to B$_2$O$_3$ by reaction with BCl$_3$ according to Equation 11. Then the B$_2$O$_3$ could be removed by reaction with HF according to Equation 12.

In another example, MoS$_2$ could first be oxidized using ozone according to:

$$MoS_2 + 3O_3 \rightarrow MoO_3 + 2SO_3 \qquad (17)$$

This reaction is predicted to be spontaneous based on a predicted Gibbs Free energy change of ΔG=−379 kcal/mole. Subsequently, MoO$_3$ could be converted to B$_2$O$_3$ by reaction with BCl$_3$ according to Equation 14. Then the B$_2$O$_3$ could be removed by reaction with HF according to Equation 12.

The methods can be further expanded to additional materials, as discussed in Example 7.

Methods

The invention provides a method of promoting atomic layer etching (ALE) on a solid substrate comprising a first metal compound. In certain embodiments, the method comprises (a) contacting at least a portion of the surface of the solid substrate with an oxidant, whereby a first metal oxide is formed on the portion of surface of the solid substrate contacted with the oxidant. In other embodiments, the method comprises (b) optionally contacting at least a portion of the surface of the first metal oxide with a second metal compound, whereby a volatile first metal species, and a second metal oxide are formed. In yet other embodiments, the method comprises contacting the surface of the first metal oxide formed in (a), and/or the second metal oxide formed in (b), with a fluorinating agent, whereby a volatile metal fluoride is formed and ALE of the solid substrate is promoted.

In certain embodiments, the first metal compound comprises at least one selected from the group consisting of a metal-Group III, metal-Group IV, metal-Group V, metal-Group VI, elemental metal, metal alloy, hybrid organic-inorganic material, and any combinations of thereof. In certain embodiments, the first metal compound comprises at least one selected from the group consisting of a metal boride, metal carbide, metal silicide, metal germanide, metal nitride, metal phosphide, metal arsenide, metal antimonide, metal sulfide, metal selenide, metal telluride, an elemental metal, metal alloy, hybrid organic-inorganic material; and any combinations thereof.

In certain embodiments wherein step (b) is not carried out, the first metal compound comprises a metal species capable of forming a metal fluoride upon reaction with the fluorinating agent, wherein the metal fluoride is volatile under the reaction conditions. In other embodiments, the first metal compound comprises a metal species capable of forming a metal fluoride with a melting point of less than 100° C. at 1 atm pressure. In yet other embodiments, the first metal compound comprises a metal species capable of forming a metal fluoride with a melting point of less than 200° C. at 1 atm pressure. In yet other embodiments, the first metal compound comprises a metal species capable of forming a metal fluoride with a melting point of less than 250° C. at 1 atm pressure.

In certain embodiments wherein step (b) is not carried out, the first metal compound comprises at least one selected from the group consisting of Ti, Ta, Nb, V, W, Mo, Ir, Ru, Rh, Re, Au, Cr and Pt. In certain embodiments wherein step (b) is not carried out, the first metal compound comprises at least one selected from the group consisting of B, Si, Ge, As, Sb and Te.

In certain embodiments wherein step (b) is carried out, the first metal compound comprises a metal species capable of forming at least one selected from the group consisting of a volatile metal oxyfluoride, a volatile metal chloride, a volatile metal oxychloride, a volatile metal bromide, a volatile oxybromide, a volatile metal iodide, a volatile oxyiodide, and a volatile metal organic compound.

In other embodiments wherein step (b) is carried out, the first metal compound comprises a metal species capable of forming a metal fluoride metal oxyfluoride, metal chloride, metal oxychloride, metal bromide, metal oxybromide, metal iodide or metal oxyiodide with a melting point of less than 100° C. at 1 atm pressure. In yet other embodiments, the first metal compound comprises a metal species capable of forming a metal fluoridemetal oxyfluoride, metal chloride, metal oxychloride, metal bromide, metal oxybromide, metal iodide or metal oxyiodide with a melting point of less than 200° C. at 1 atm pressure. In yet other embodiments, the first metal compound comprises a metal species capable of forming a metal fluoridemetal oxyfluoride, metal chloride, metal oxychloride, metal bromide, metal oxybromide, metal iodide or metal oxyiodide with a melting point of less than 250° C. at 1 atm pressure.

In certain embodiments wherein step (b) is carried out, the first metal compound comprises at least one metal capable of forming a volatile fluoride selected from the group consisting of Ti, Ta, Nb, V, W, Mo, Ir, Ru, Rh, Re, Au, Cr and Pt. In other wherein step (b) is carried out, the first metal compound comprises at least one metal that does not form a volatile fluoride selected from the group consisting of Al, Hf, Zr, Fe, Ni, Co, Mn, Mg, Rh, Cr, Ga, In, Zn, Pb, Cu, Cd, Hg, Ca, Li, Ag, Sn and Y.

In certain embodiments wherein step (b) is carried out, the second metal compound comprises a metal species capable of forming a stable metal oxide species on the surface of the solid substrate. In other embodiments wherein step (b) is carried out, the second metal compound comprises a metal species capable of forming at least one selected from the group consisting of a volatile metal fluoride, volatile metal oxyfluoride, volatile metal chloride, volatile metal oxychloride, volatile metal bromide, volatile metal oxybromide, volatile metal iodide and volatile metal oxyiodide. In other embodiments wherein step (b) is carried out, the second metal compound comprises a metal species capable of forming a metal fluoride metal oxyfluoride, metal chloride, metal oxychloride, metal bromide, metal oxybromide, metal iodide or metal oxyiodide with a melting point of less than 100° C. at 1 atm pressure. In yet other embodiments, the second metal compound comprises a metal species capable of forming a metal fluoridemetal oxyfluoride, metal chloride, metal oxychloride, metal bromide, metal oxybromide, metal iodide or metal oxyiodide with a melting point of less than 200° C. at 1 atm pressure. In yet other embodiments, the second metal compound comprises a metal species capable of forming a metal fluoridemetal oxyfluoride, metal chloride, metal oxychloride, metal bromide, metal oxybromide, metal iodide or metal oxyiodide with a melting point of less than 250° C. at 1 atm pressure.

In certain embodiments wherein step (b) is carried out, the second metal compound comprises a metal species capable of forming at least one selected from the group consisting of a volatile metal oxyfluoride, volatile metal chloride, volatile metal oxychloride, volatile metal bromide, volatile metal oxybromide, volatile metal iodide and volatile metal oxyiodide upon reaction with the first metal oxide.

In certain embodiments wherein step (b) is carried out, the second metal compound is at least one selected from $BCl_3$, $B(CH_3)_3$, $BBr_3$, $BI_3$, and $TiCl_4$. In other embodiments wherein step (b) is carried out, the second metal oxide is $B_2O_3$ or $TiO_2$.

In certain embodiments the oxidant is a gaseous oxidant. In other embodiments, the oxidant is selected from the group consisting of $O_2$, $H_2O_2$, $O_3$, oxygen plasma, reactive oxygen radical species, $NO_2$ plasma, $N_2O$ plasma, NO plasma, $HNO_3$ plasma and $SO_2$ plasma.

In certain embodiments, the fluorinating agent is a gaseous fluorinating agent. In other embodiments, the fluorinating agent is at least one compound selected from the group consisting of HF, $SF_4$, $XeF_2$, $F_2$, and $SF_6$ plasma. In other embodiments, the fluorinating agent is any other fluorine containing plasma known in the art.

In certain embodiments, steps (a) and (c) [or (a), (b), and (c)] can be repeated one or more times. In certain embodiments, the method allows for etching of the solid substrate at a rate of about 0.1 Å per cycle to about 3.0 Å per cycle of steps (a)-(c).

In certain embodiments, the solid substrate is deposited on an inert substrate material. In other embodiments, the inert substrate material comprises silicon. In other embodiments, the inert substrate material comprises a silicon wafer.

In certain embodiments, the solid substrate is formed using atomic layer deposition.

In certain embodiments, the method of the invention is used for at least one purpose selected from the group consisting of patterning the solid substrate, cleaning the solid substrate, creating pores in the solid substrate and surface smoothing.

The invention further provides a method of smoothing the surface of a solid substrate, wherein the solid substrate comprises a first metal compound. Smoothing of surfaces is of interest in the semiconductor industry. For example, smoothing can be used to obtain damage-free layers. In contrast, sputtering can be used to remove some materials, but leaves a rough, damaged surface. ALE can be used to remove the damaged layer and smooth the surface to produce a "damage-free surface."

Surface smoothing can also be used to obtain very high quality ultrathin films. For example, high quality ultrathin films can be produced by a "deposit/etch back" strategy by depositing a thicker film and then etching back to a thinner film. In a non-limiting embodiment, nucleation effects can lead to roughness in the ultrathin deposited film; once a continuous and pinhole-free thicker film is formed, ALE can etch this film back and obtain a smoother surface than would have been produced by growing to this ultrathin thickness.

In certain embodiments, the invention further provides a method of removing clusters, islands and other raised defects formed by atomic layer deposition (ALD) on a surface. These clusters and islands are the result of nucleation delays during ALD. The clusters and islands may be composed of any metal compounds disclosed elsewhere herein. In area selective deposition, growth is favored on some surfaces and not favored on other surfaces. These clusters and islands are not desired on the unfavored surfaces. The clusters and islands can be etched away through the ALE methods of the invention to improve the selectivity of the ALD on the preferred surface.

In certain embodiments, each cycle of steps (a)-(c) is self-limiting. In other embodiments, each cycle of steps (a)-(c) allows for about the same etch rate and/or mass loss of the solid substrate. In yet other embodiments, the resulting etched solid substrate has about the same or lower surface roughness as the starting solid substrate. In yet other embodiments, the density of the etched solid substrate is about the same as of the starting solid substrate. In yet other embodiments, the refractive index of the etched solid substrate is about the same as of the initial solid substrate.

In certain embodiments, the solid substrate comprises at least one additional metal compound, and ALE of the first metal compound is selective over ALE of the at least one additional metal compound. In other embodiments, the ALE rate is (a) controlled by the solid substrate temperature, and/or (b) enhanced by pressure of the oxidation and/or fluorination reagent and/or the second metal precursor. In yet other embodiments, the ALE is performed using a spatial ALE technique.

In certain embodiments, the surface of the starting solid substrate is at least partially masked, whereby only a portion of the surface of the solid substrate is exposed. In other embodiments, the surface of the starting solid substrate is at least partially masked with a photoresist. In yet other embodiments, the solid substrate is further patterned using a technique selected from the group consisting of monolayer self-assembling, nano-imprint and stamping.

In certain embodiments, the method comprises applying directionally to a fraction of the surface of the solid substrate an agent that promotes removal of at least a fraction of any surface species that results from the ALE reaction and is bound to, and/or adsorbed on, a fraction of the surface of the solid substrate. In other embodiments, the applying is performed concomitantly with the ALE reaction and/or in between steps of the ALE reaction.

In certain embodiments, the agent is at least one selected from the group consisting of a radical, photon, ion, electron, catalyst, and molecular adsorbate. In other embodiments, the agent is generated by a plasma. In yet other embodiments, the agent comprises a radical and the plasma comprises a $H_2$ plasma. In yet other embodiments, the agent comprises a photon and the plasma comprises an Ar plasma. In yet other embodiments, the agent comprises an alkali metal catalyst, which is formed on the solid substrate from an alkali metal molecular precursor. In yet other embodiments, wherein the agent comprises a molecular precursor that adsorbs on the solid substrate and displaces other surface-adsorbed species that limit progress of the thermal ALE.

Compositions

The invention provides a solid substrate obtained according to the methods of the invention. The invention further provides a 3D structure with surface features obtained according to the methods of the invention. The invention further provides a patterned solid substrate obtained according to the methods of the invention. The invention further provides a smoothened solid substrate obtained according to the methods of the invention. The invention further provides a nanodevice fabricated using the methods of the invention.

Definitions

As used herein, each of the following terms has the meaning associated with it in this section.

As used herein, unless defined otherwise, all technical and scientific terms generally have the same meaning as commonly understood by one of ordinary skill in the art to which this invention belongs. Generally, the nomenclature used herein and the laboratory procedures in surface chemistry are those well-known and commonly employed in the art.

As used herein, the articles "a" and "an" refer to one or to more than one (i.e. to at least one) of the grammatical object of the article. By way of example, "an element" means one element or more than one element.

As used herein, the term "about" will be understood by persons of ordinary skill in the art and will vary to some extent on the context in which it is used. As used herein, "about" when referring to a measurable value such as an amount, a temporal duration, and the like, is meant to encompass variations of ±20% or ±10%, more preferably ±5%, even more preferably ±1%, and still more preferably ±0.1% from the specified value, as such variations are appropriate to perform the disclosed methods.

As used herein, the term "ALD" refers to atomic layer deposition, which is a thin film deposition method. In certain embodiments, the term "thin" refers to a range of thickness from about 0.1 nm to about 300 nm. ALD uses a self-limiting reaction sequence that deposits films in discrete steps limited by surface site chemical reactions. It produces continuous films with atomically controlled thicknesses, high conformality, and typically pinhole-free and atomically smooth surfaces. These are essential properties as design constraints push device technologies to ever smaller sizes. In certain embodiments, molecular layer deposition (MLD) is a non-limiting example of ALD. In other embodiments, materials prepared using ALD include materials prepared using MLD. In yet other embodiments, MLD comprises depositing an alkoxide polymer on a substrate. In yet other embodiments, MLD comprises generating a polymer by alternating reactions of chemicals selected from a first and a second group; wherein the first group includes, but is not limited to, trimethyl aluminum, titanium tetrachloride, and diethyl zinc; and wherein the second group includes, but is not limited to, ethylene glycol, propylene glycol, glycerol, hydroquinone, 1,2-ethanedithiol, and 1,3-propanedithiol.

As used herein, the term "ALE" refers to atomic layer etching, which is a thin film etching method. In certain embodiments, the term "thin" refers to a range of thickness from about 0.1 nm to about 300 nm. ALE uses a series of self-limiting chemical modification steps which only affect the top atomic layers of a substrate, and etching steps which remove only the chemically-modified areas, allowing for the removal of individual atomic layers.

As used herein, the term "instructional material" includes a publication, a recording, a diagram, or any other medium of expression that may be used to communicate the usefulness of the compositions and/or methods of the invention. In certain embodiments, the instructional material may be part of a kit useful for generating a composition of the invention. The instructional material of the kit may, for example, be affixed to a container that contains the compositions of the invention or be shipped together with a container that contains the compositions. Alternatively, the instructional material may be shipped separately from the container with the intention that the recipient uses the instructional material and the compositions cooperatively. For example, the instructional material is for use of a kit; instructions for use of the compositions; or instructions for use of the compositions.

As used herein, the term "µm" is the abbreviation for "micron" or "micrometer", and it is understood that 1 µm=0.001 mm=$10^{-6}$ m=1 millionth of a meter.

As used herein, the term "nanodevice" refers to a device that has at least one component with at least one spatial dimension less than 1 micron.

As used herein, the term "nm" is the abbreviation for "nanometer" and it is understood that 1 nm=1 nanometer=$10^{-9}$ m=1 billionth of a meter.

As used herein, a "stable" compound refers to a compound or reaction product that does not spontaneously decompose or desorb from the surface of a substrate under reaction conditions.

As used herein, a "volatile" compound refers to a compound or reaction product that spontaneously desorbs from the surface of a substrate under reaction conditions.

Abbreviations used herein include: ALD, atomic layer deposition; ALE, atomic layer etching; atm, atmosphere, equivalent to 760 mmHg (torr); vs., versus.

Throughout this disclosure, various aspects of the invention may be presented in a range format. It should be understood that the description in range format is merely for convenience and brevity and should not be construed as an inflexible limitation on the scope of the invention. Accordingly, the description of a range should be considered to have specifically disclosed all the possible sub-ranges as well as individual numerical values within that range and, when appropriate, partial integers of the numerical values within ranges. For example, description of a range such as from 1 to 6 should be considered to have specifically disclosed sub-ranges such as from 1 to 3, from 1 to 4, from 1 to 5, from 2 to 4, from 2 to 6, from 3 to 6, and so on, as well as individual numbers within that range, for example, 1, 2, 2.7, 3, 4, 5, 5.3, and 6. This applies regardless of the breadth of the range.

Every formulation or combination of components described or exemplified can be used to practice the invention, unless otherwise stated. Specific names of compounds are intended to be exemplary, as it is known that one of ordinary skill in the art can name the same compounds differently. Although the description herein contains many embodiments, these should not be construed as limiting the scope of the invention but as merely providing illustrations of some of the presently preferred embodiments of the invention.

Those skilled in the art will recognize, or be able to ascertain using no more than routine experimentation, numerous equivalents to the specific procedures, embodiments, claims, and examples described herein. Such equivalents were considered to be within the scope of this invention and covered by the claims appended hereto. For example, it should be understood, that modifications in reaction conditions, including but not limited to reaction times, reaction size/volume, and experimental reagents, such as solvents, catalysts, pressures, atmospheric conditions, e.g., nitrogen atmosphere, and reducing/oxidizing agents, with art-recognized alternatives and using no more than routine experimentation, are within the scope of the present application. In general the terms and phrases used herein have their art-recognized meaning, which can be found by reference to standard texts, journal references and contexts known to those skilled in the art. Any preceding definitions are provided to clarify their specific use in the context of the invention.

The following examples further illustrate aspects of the present invention. However, they are in no way a limitation of the teachings or disclosure of the present invention as set forth herein.

EXAMPLES

The invention is now described with reference to the following Examples. These Examples are provided for the purpose of illustration only, and the invention is not limited to these Examples, but rather encompasses all variations that are evident as a result of the teachings provided herein.
Materials and Methods
Atomic Layer Etching of TiN Films All the reactions were conducted in a viscous flow, hot-wall reactor defined by a stainless steel tube with the length of ~60 cm and inside diameter of 3.8 cm. The reactor was isothermally heated by heating elements attached on the outside of the reactor. The reaction temperatures from 150 to 350° C. were stabilized within ±0.04° C. of the set point by a proportional-integral-derivative (PID) temperature controller (2604, Eurotherm). A constant flow of 150 sccm UHP nitrogen gas ($N_2$, 99.999%, Airgas) was regulated by mass flow controllers (Type 1179A, MKS). This $N_2$ gas flow established a base pressure of ~1 Torr in the reactor when pumped by a mechanical pump (Pascal 2015SD, Alcatel). The pressure was recorded by a capacitance manometer (Baratron 121A, MKS).

The demonstration of spontaneous etching of $TiO_2$ was performed using an in situ quartz crystal microbalance (QCM) located at the center of the hot-wall reactor. The gold-coated quartz crystal (polished, RC crystal, 6 MHz, Phillip Technologies) was placed in a sensor head (BSH-150, Inficon) and sealed with high temperature epoxy (Epo-Tek H21D, Epoxy technology). The mass changes during the reactions were measured by a thin film deposition monitor (Maxtek TM-400, Inficon). The $TiO_2$ films were deposited on the QCM crystal using $TiO_2$ ALD with titanium tetrachloride ($TiCl_4$, 99%, Strem) and deionized $H_2O$ (Chromasolv for HPLC, Sigma-Aldrich) as the reactants at 200, 250, and 300° C. HF exposures on these $TiO_2$ ALD films were performed at the same temperature as the $TiO_2$ ALD reactions.

The HF source was a HF-pyridine solution (70 wt % HF, Sigma-Aldrich). A gold-plated stainless steel bubbler was filled with the HF-pyridine solution in a dry $N_2$-filled glove bag and held at room temperature. The HF vapor pressure of 90-100 Torr was in equilibrium with the HF-pyridine solution. Only HF vapor was delivered in the gas phase as confirmed by mass spectrometry. The pressure transients of HF were adjusted to ~80 mTorr using a metering bellows-sealed valve (SS-4BMG, Swagelok).

The $O_3$ was produced in the corona discharge ozone generator (LG-14, Del Ozone). A flow of 480 sccm of UHP oxygen gas ($O_2$, 99.994%, Airgas) was supplied to produce a maximum ~5 wt. % of $O_3$ in $O_2$. When the $O_3$ was not delivered to the reactor, the $O_3$ was passed through an ozone destruct unit (ODS-1, Ozone Solutions) connected to the exhaust line. Hydrogen peroxide ($H_2O_2$) vapor was evaporated with $H_2O$ from a $H_2O_2$ solution (50 wt. %, Sigma Aldrich) contained in a glass bubbler. The $H_2O_2$ solution was held at room temperature.

The TiN films were prepared by SEMATECH. The TiN film was deposited on a 300 mm diameter silicon wafer by semiconductor ALD processes in commercially available tools. The initial thickness of TiN was measured as ~70 Å by spectroscopic ellipsometry (SE) measurements. The TiN film on the silicon wafers was cleaved to samples that were 1.25 cm by 1.25 cm in size and used in ALE experiments. For the selectivity experiments, the $Al_2O_3$, $HfO_2$, $ZrO_2$, $SiO_2$, and $Si_3N_4$, thin films on silicon wafers were placed together with the TiN film in the reactor. The $Al_2O_3$, $HfO_2$ and $ZrO_2$ films were prepared by SEMATECH and deposited by ALD processes. The $SiO_2$ and $Si_3N_4$ films were prepared by SEMATECH and deposited by chemical vapor deposition (CVD) processes.

$Al_2O_3$ ALD films were coated inside the reactor before TiN ALE to minimize $O_3$ decomposition on the wall of the hot-wall reactor. The ALE reactions were conducted using a reaction sequence represented as x-30-y-30. This reaction sequence consists of an exposure of oxidation reagent for x s, 30 s of $N_2$ purge, y s of HF exposure and 30 s of $N_2$ purge. The ALE reactions using $O_3$ as an oxidation reagent were performed using an optimized reaction sequence of 3-30-1-30. The ALE reactions using $H_2O$, as an oxidation source were performed using an optimized reaction sequence of 2.5-30-1-30.

Ex situ spectroscopic ellipsometry (SE) measurements determined the thicknesses of the various films. Ψ and Δ at 240-900 nm were measured by a spectroscopic ellipsometer (M-2000, J. A. Woollam) and fitted by the analysis software (CompleteEASE, J. A. Woollam). These measurements employed an incidence angle of 75° near Brewster's angle of the silicon wafer. A Lorentz model was used for fitting the thickness of the TiN film. A Sellmeier model was used for fitting of the $Al_2O_3$, $HfO_2$, $ZrO_2$, $SiO_2$, and $Si_3N_4$ films.

The thicknesses, roughness, and film density were obtained by ex situ XRR analysis. The x-ray reflectivity (XRR) scans at 300-9000 arcsec were measured by a high resolution x-ray diffractometer (Bede D1, Jordan Valley Semiconductors) using Cu Kα radiation (λ=1.540 Å). The filament voltage was 40 kV and the current was 35 mA in the x-ray tube. All XRR scans were recorded with a 10 arcsec step size and a 5 s acquisition time and fitted using the analysis software (Bede REFS, Jordan Valley Semiconductors) to determine film thickness, film density and surface roughness.

Atomic Layer Etching of W and $WO_3$ Films

W samples were deposited on Si wafers with a 500 nm thermal oxide layer. The $SiO_2$ layer improves the sensitivity of the in situ spectroscopic ellipsometry (SE) analysis by providing interference enhancement. $Al_2O_3$ ALD films were first grown on the $SiO_2$ thermal oxide layer at 130° C. using 15 $Al_2O_3$ ALD cycles. These $Al_2O_3$ ALD films provided an adhesion layer for W ALD growth. W ALD films with a thickness of 250 Å were then deposited at 130° C. with sequential self-limiting reactions of $WF_6$ and $Si_2H_6$. These $Al_2O_3$ ALD and W ALD films were deposited in a separate hot-wall viscous flow reactor. Upon exposure to atmosphere, an oxide thickness of 12-30 Å is formed on the W film as determined by X-ray photoelectron spectroscopy (XPS) and X-ray reflectivity (XRR) analysis.

The Si wafer was then diced to produce W coupons with dimensions of 1.6×1.6 cm. These W coupons were placed in a reaction chamber similar in design to plasma atomic layer deposition (ALD) reactors equipped for in situ SE measurements. The chamber walls were coated with ~500 cycles of $Al_2O_3$ ALD using $Al(CH_3)_3$ and $H_2O$ as the reactants at the chamber wall temperature of 170° C. $WO_3$ films were prepared by the oxidation of the W ALD films at 280° C. using an $O_2$ plasma at 600 W with an $O_2$ pressure of 100 mTorr. The $O_2$ plasma exposures produced a $WO_3$ film thickness of 130-150 Å on the W ALD films.

A remote inductively coupled plasma (ICP) provided oxygen radicals for the oxidation of W to $WO_3$. A quartz tube (6 cm inner diameter×25 cm long) encircled by a helical copper coil was the ICP source. A 13.56 MHz RF generator (Paramount RF Power Supply, Advanced Energy) and 50Ω impedance matching network (Navigator Digital Matching Network, Advanced Energy) were used in conjunction to generate the ICP plasma. The distance between the ICP source and the W coupon was ~4 cm.

Figure 2:
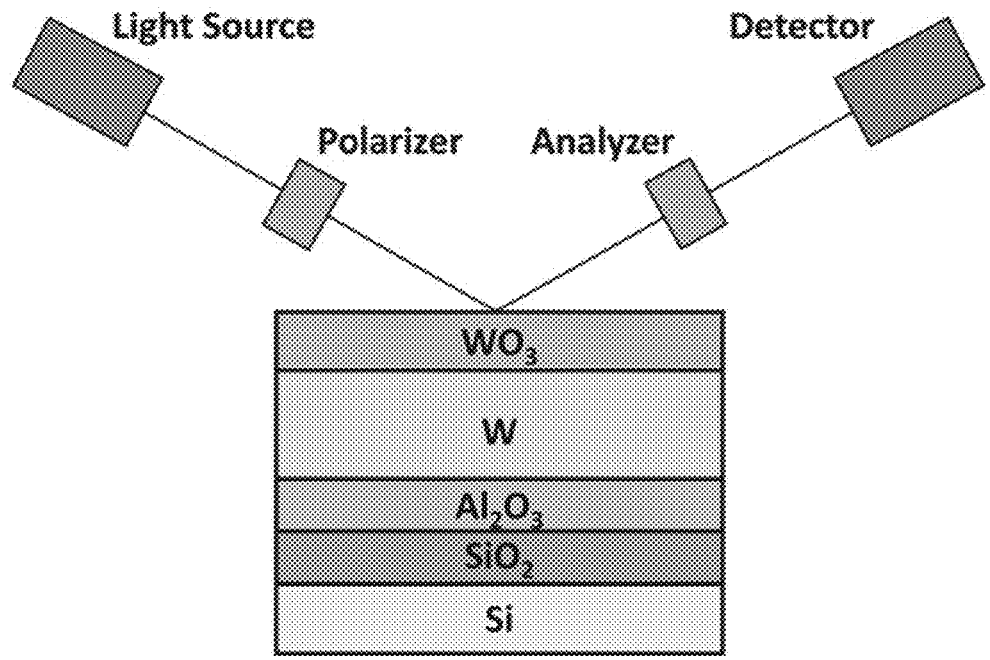
FIG. 2 is a schematic showing an ellipsometer beam interacting with a film stack comprised of $WO_3$, W, $Al_2O_3$, $SiO_2$, and underlying Si substrate.

Etching of the $WO_3$ and W films was monitored by in situ SE using a J. A. Woollam M-2000D® ellipsometer having a spectral range of 240-1700 nm and using an incidence angle of 70°. The $WO_3$ and W films were analyzed to obtain film thicknesses after each reaction cycle or each individual reaction. A schematic showing the film stack and ellipsometer optical beams is shown in FIG. 2. Note that the individual layer thicknesses are not to scale. SE has the ability to measure the thicknesses of each individual layer in the film stack. This allows for simultaneous determination of the $WO_3$ and W film thicknesses.

The $WO_3$ films were analyzed using the COMPLETE EASE® software package (J. A. Woollam). The model employed a Tauc-Lorentz oscillator and a Gaussian oscillator. Only the parameters of the Tauc-Lorentz oscillator model were varied from the starting parameters to increase the accuracy of the model. The metal W layer underneath the $WO_3$ layer was measured by a B-Spline model. n and k values for bulk W were used as the initial parameters and were varied to fit the experimental data.

Boron trichloride (99.9%, Synquest Laboratories) and HF-pyridine (70 wt % HF, Sigma-Aldrich) were used as the reactants. The reactants were separately dosed into the reaction chamber together with a constant stream of ultra-high purity (UHP) nitrogen. The reactants were introduced using two pneumatic valves (SWAGELOK®-HBVVCR4-C for $BCl_3$ or SWAGELOK®-6LVV-DPFR4-P-C for HF) on either side of a conductance limiting valve (Swagelok® SS-4BMG-VCR). The pneumatic valves were actuated using LABVIEW®. Between each reactant exposure, the reaction chamber was purged with UHP nitrogen gas for 130 s at a pressure of 1180 mTorr. The $O_3$ for the oxidation reaction during W ALE was produced by an O3ONIA® ozone generator with oxygen [Airgas, 99.999%]. The gas flow from the ozone generator contained ~10% of $O_3$ in $O_2$. The $O_2$ pressure used for the oxidation reaction was 70 mTorr. Therefore, the $O_3$ pressure was ~7 mTorr. The HF and $BCl_3$ purge times were 130 s during W ALE using the $O_2/O_3$ exposures. The purge time after the $O_2/O_3$ exposures was 60 s.

Samples were heated on a sample stage inside of the reaction chamber. A constant temperature of 207° C. was used for all of the ALE experiments performed to determine the self-limiting conditions. The temperature was initially targeted to be 200° C. A temperature calibration revealed that the temperature was 207° C. The temperature of the sample stage was varied during the studies of $WO_3$ ALE etch rate vs. temperature. The chamber walls were held constant at 170° C. A rotary vane pump (ALCATEL® 2010) was used to pump the chamber to a base pressure of ~20 mTorr. A capacitance monometer measured the chamber base pressure and pressure transients from each reactant.

Example 1: Spontaneous Etching of $TiO_2$ by HF

Figure 3:
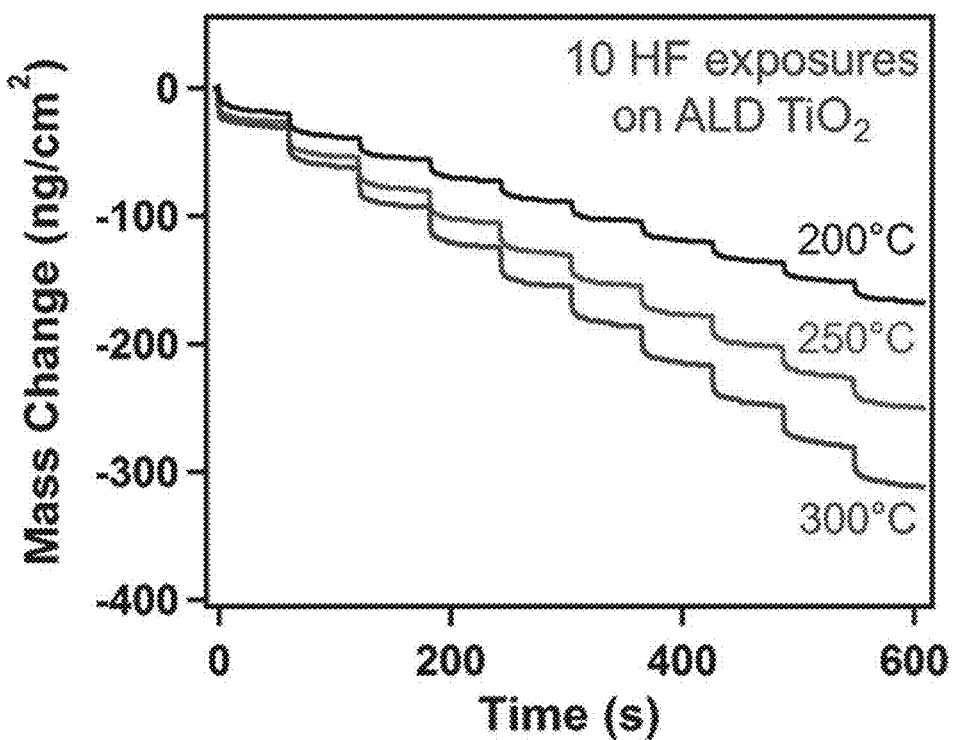
FIG. 3 is a graph showing mass changes during 10 consecutive HF exposures on $TiO_2$ ALD film at 200, 250, and 300° C.

FIG. 3 shows the mass changes during 10 consecutive HF exposures on $TiO_2$ films grown on the quartz crystal microbalance. The $TiO_2$ ALD films were deposited using $TiCl_4$ and $H_2O$ as the reactants at 200, 250, and 300° C. Each HF exposure for 1 s leads to a mass loss consistent with spontaneous etching of the $TiO_2$ film. The average mass change during the HF exposure is −17 $ng/cm^2$ at 200° C. There are slightly higher mass changes at higher temperatures. Mass changes of −25 $ng/cm^2$ and −32 $ng/cm^2$ were obtained with the same HF exposure time of 1 s at 250° C. and 300° C., respectively. These results suggest that a HF exposure of 1 s is able to etch a $TiO_2$ thickness of 0.66-0.85 Å at 250-300° C. based on the density of 3.76 $g/cm^3$ for $TiO_2$ ALD films.

The fluorination reaction given by Equation 3 has a reaction enthalpy $\Delta H=-22.7$ kcal/mol at 25° C. This negative enthalpy value is maintained at high temperatures with $\Delta H=-21.9$ kcal/mol at 250° C. Nearly constant negative $\Delta H$ values indicates the reaction is exothermic at all temperatures. The Gibbs free energy of this reaction is favorable at room temperature with $\Delta G=-6.1$ kcal/mol at 25° C. The Gibbs free energy change becomes unfavorable at temperatures >150° C. for entropic reasons. The $\Delta G$ value at 250° C. is +6.3 kcal/mol. However, the $\Delta G$ values for the HF reaction with $TiO_2$ assumes equilibrium conditions. The etching reaction could be favorable under actual reaction conditions in the presence of excess of HF vapor when the $H_2O$ reaction product is quickly removed by the $N_2$ purge gas.

$$TiO_2 + 4HF \rightarrow TiF_4 + 2H_2O \qquad (3)$$

Example 2: Thermal TiN ALE Using $O_3$ and HF

Figure 1B:
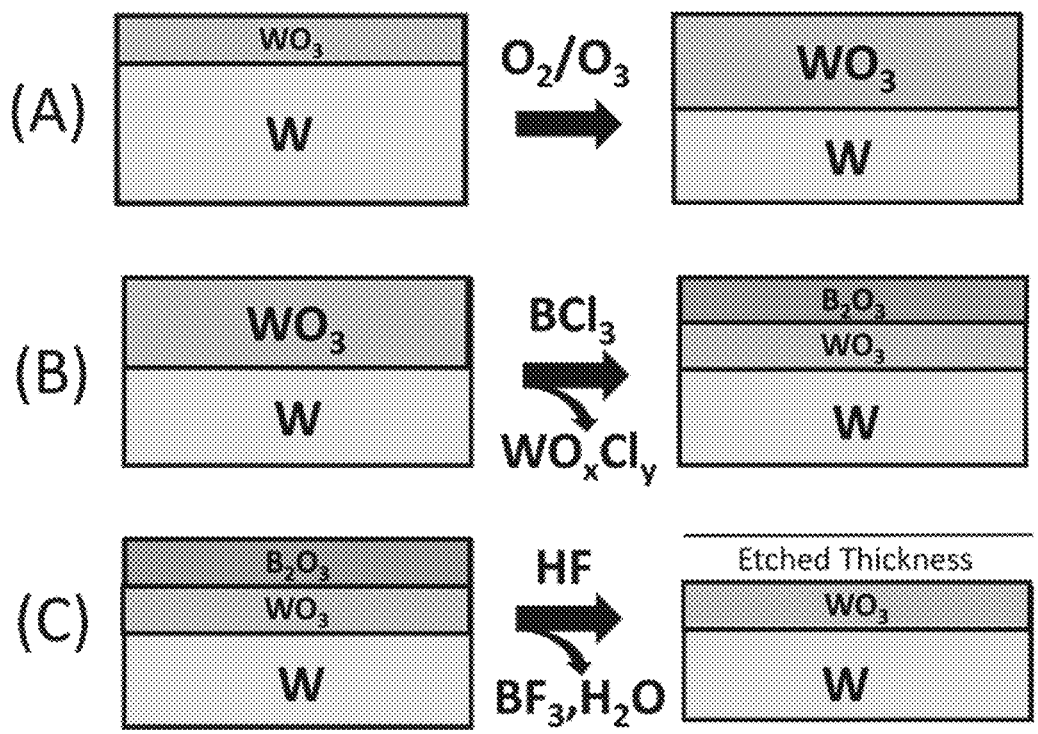
FIG. 1B is a scheme showing an oxidation, conversion and fluorination reaction, according to an exemplary embodiment of the invention. Step (A) shows oxidation of W using $O_2/O_3$. Step (B) shows conversion of W to $WO_3$ using $BCl_3$. Step (C) shows fluorination of $B_2O_3$ by HF to form volatile $BF_3$ and $H_2O$.

HF by itself or in conjunction other metal precursors cannot etch TiN. However, HF is able to etch $TiO_2$ spontaneously as shown in FIG. 3. These results suggest that if a $TiO_2$ layer can be formed on a TiN substrate using an oxidizing reagent, then a fluorination reagent, such as HF, should be able to etch the $TiO_2$ layer on the TiN substrate. These oxidation and fluorination reactions define the thermal ALE process illustrated in FIG. 1.

Ozone ($O_3$) is a gas phase reagent with strong oxidation power. $O_3$ has often been preferred to $O_2$ as an oxygen source for metal oxide ALD when its stronger oxidizing ability is needed or the $H_2O$ purge is difficult. In addition, $O_3$ makes an excellent passivation oxide layer on polycrystalline aluminum metal or crystalline silicon. $O_3$ also can be employed as an oxidation reagent for the formation of a $TiO_2$ layer on the TiN substrate.

The proposed oxidation reaction of TiN using $O_3$ is given by Equation 2. This oxidation reaction is thermochemically favorable. The Gibbs free energy of this reaction is $\Delta G=-242.1$ kcal/mol at 250° C. Other nitrogen-containing reaction products in addition to NO, such as $N_2$ and $NO_2$, may be possible. The $\Delta G$ values with $N_2$ or $NO_2$ as the reaction product yield favorable Gibbs free energy values of $\Delta G=-219$ kcal/mol or $-288$ kcal/mol at 250° C., respectively.

$$TiN+3O_3 \rightarrow TiO_2+NO+3O_2 \qquad (2)$$

The fluorination reaction of HF with $TiO_2$ is given by Equation 3. This reaction has $\Delta G$ values of $-6.1$ kcal/mol at 25° C. and $+6.3$ kcal/mol at 250° C. As discussed elsewhere herein, the positive $\Delta G$ value at 250° C. may not preclude the reaction because the reactions are not performed under equilibrium conditions. The production of $TiF_4$ leads to etching because $TiF_4$ is a volatile solid that sublimes at 284° C. After HF removes the $TiO_2$ layer on the TiN substrate, HF could also form nonvolatile $TiF_3$ by fluorination of TiN. The reaction between TiN and HF is given by:

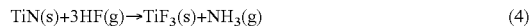

$$TiN(s)+3HF(g) \rightarrow TiF_3(s)+NH_3(g) \qquad (4)$$

This reaction is favorable with a $\Delta G$ value of $-37.0$ kcal/mol at 250° C. $TiF_3$ is nonvolatile solid with a melting point of 1200° C. and boiling point of 1400° C.

Figure 4:
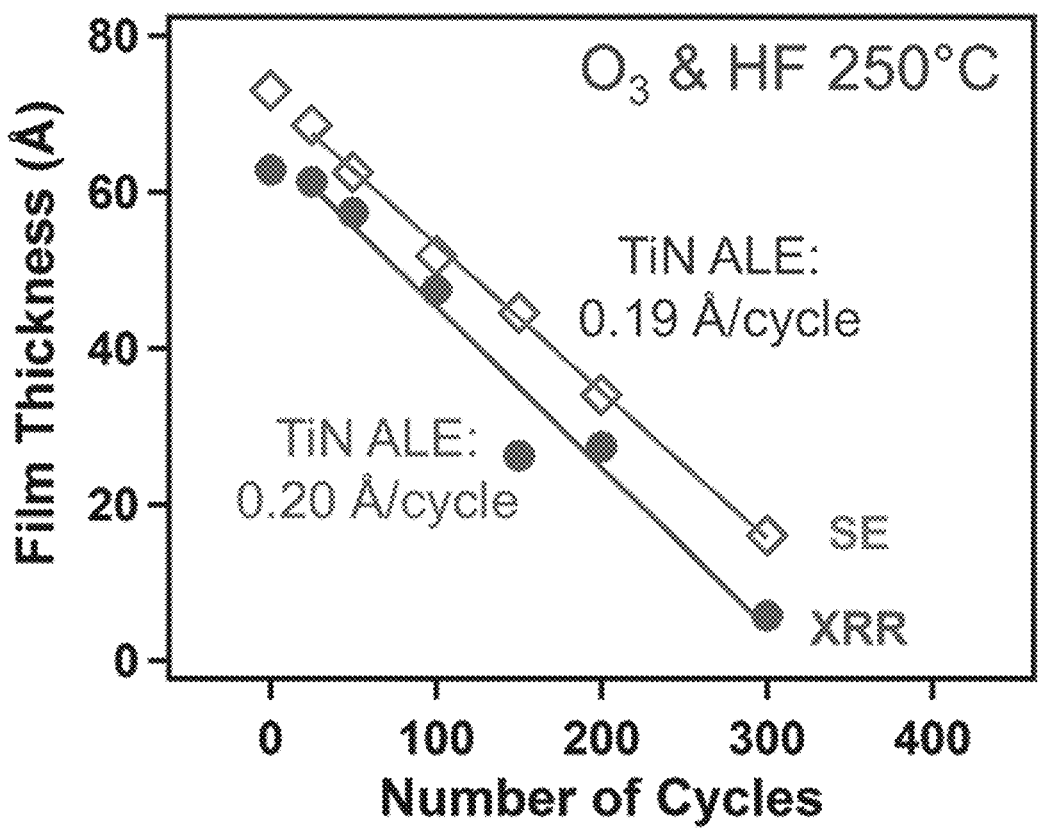
FIG. 4 is a graph showing X-ray reflectivity and spectroscopic ellipsometry measurements of TiN film thickness vs. number of $O_3$ and HF reaction cycles at 250° C.

FIG. 4 shows the spectroscopic ellipsometry (SE) and x-ray reflectivity (XRR) measurements of the initial TiN film thickness and the TiN film thickness after 25, 50, 100, 150, 200, and 300 ALE cycles using $O_3$ and HF as the reactants at 250° C. The film thickness vs. the number of ALE cycles is linear. An etch rate of 0.19 Å/cycle was obtained by SE using a least squares fitting. The XRR measurements on the same samples yield an etch rate of 0.20 Å/cycle. These XRR results are consistent with the SE results.

No TiN etch was observed when using $O_2$ by itself as the oxidation reactant together with HF. The oxidation reaction $TiN(s)+3/2O_2(g) \rightarrow TiO_2(s)+NO(g)$ is favorable having $\Delta G=-113.7$ kcal/mol at 250° C. However, the oxidation of TiN by $O_2$ at <350° C. is known to be slow to form a thin $TiO_2$ layer. The surface of TiN is also known to form an intermediate titanium oxynitride ($TiO_xN_y$) phase in addition to a thin $TiO_2$ layer. The oxidation state of Ti in this intermediate phase was 3+ and 4+ by XPS analysis. The strong oxidizing ability of $O_3$ may be necessary for oxidation of TiN or $TiO_xN_y$ to $TiO_2$. The $TiO_2$ layer can then be etched by HF during TiN ALE at 250° C.

Figure 5A:
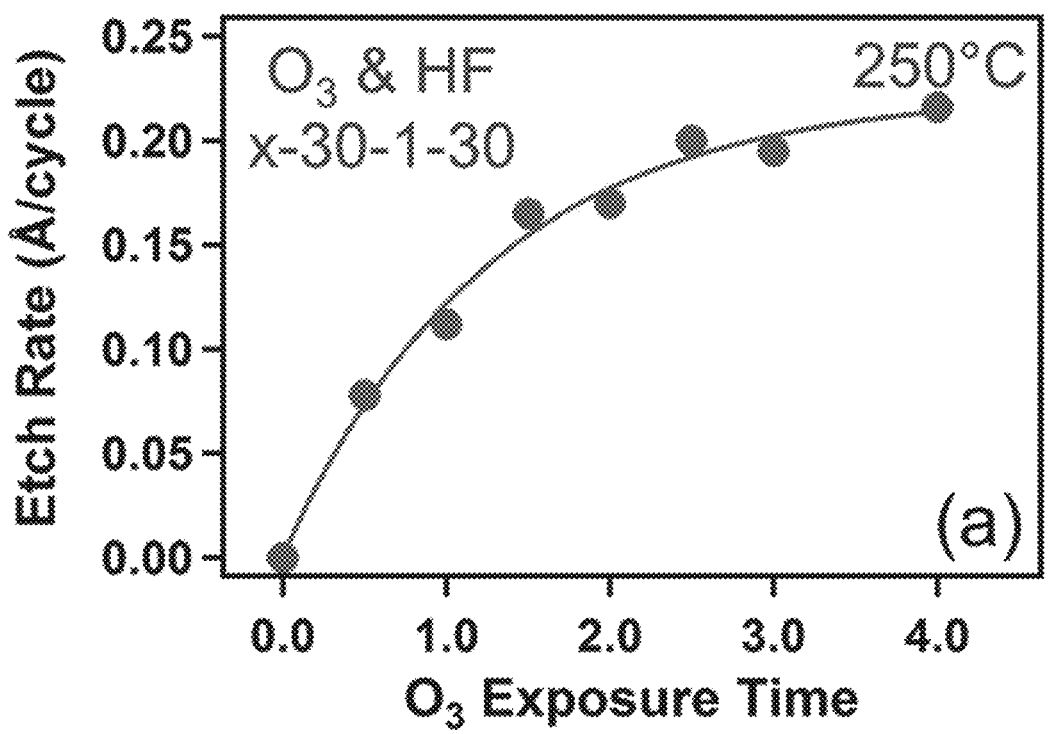
FIG. 5A is a graph of etch rates for TiN vs. $O_3$ exposure time with constant HF exposure time of 1.0 s.
Figure 5B:
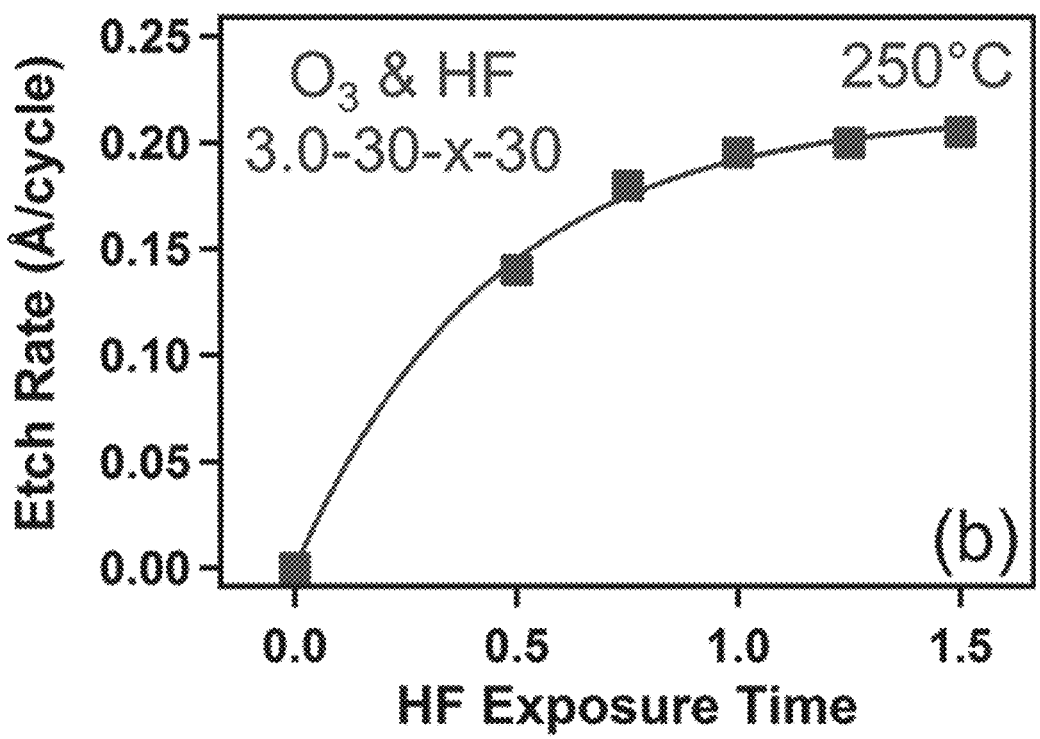
FIG. 5B is a graph of etch rates for TiN vs. $O_3$ exposure time with constant HF exposure time of 3.0 s.

FIGS. 5A-5B show the self-limiting behavior for the $O_3$ and HF exposures during TiN ALE at 250° C. The etch rates were obtained vs. reactant exposure time while holding the other reactant exposure time constant. The etch rate was determined using the average thickness change during 200 ALE cycles. FIG. 5A examines the self-limiting reaction using different $O_3$ exposure times with a HF exposure time of 1 s. A $N_2$ purge time of 30 s was used between reactant exposures. The etch rate increases and levels off at ~0.2 Å/cycle vs. the $O_3$ exposure time. The oxidation of the TiN substrate is believed to be self-limiting because of the formation of a $TiO_2$ passivation layer.

FIG. 5B examines the self-limiting reaction using different HF exposure times with an $O_3$ exposure time of 3 s. The etch rate vs. the HF exposure time increases and levels off at ~0.2 Å/cycle. The fluorination reaction is self-limiting because the etching reaction to produce volatile $TiF_4$ is limited by the thickness of the $TiO_2$ layer on the TiN substrate. HF does not etch the TiN film by itself. The HF is believed to form nonvolatile $TiF_3$ species on the TiN film. FIG. 3 shows that an HF exposure of 1 s is able to remove 25 ng/cm$^2$ or 0.66 Å of a $TiO_2$ film. This thickness of $TiO_2$ film removed by the HF exposure is much greater than the etch rate of 0.2 Å per cycle for the $TiO_2$ layer on the TiN substrate.

Figure 6:
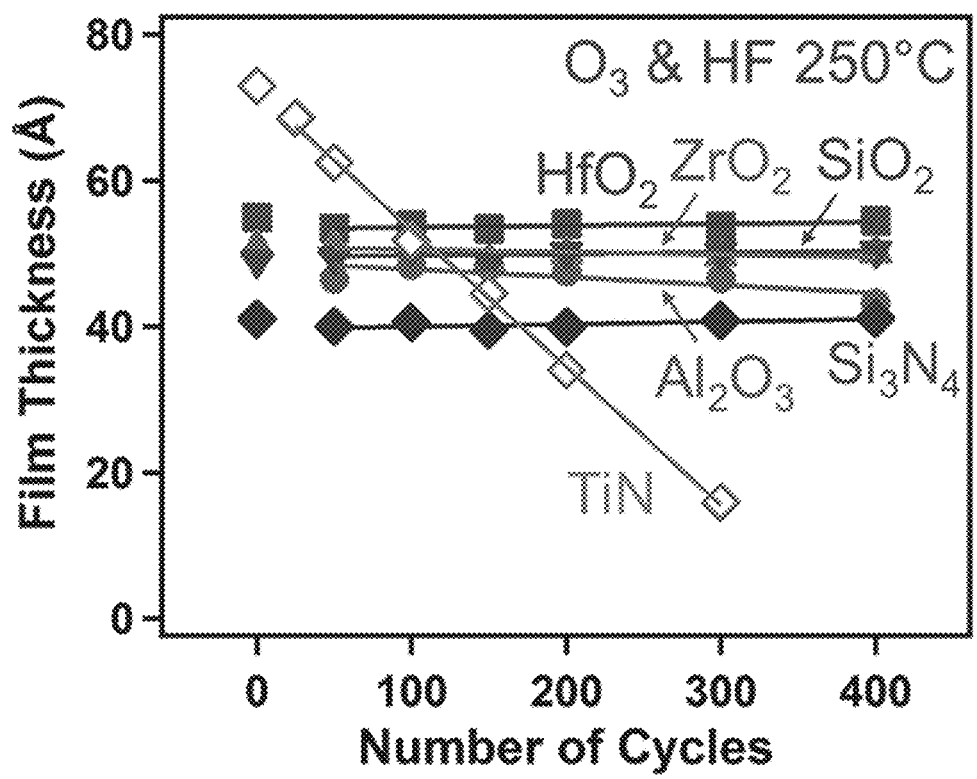
FIG. 6 is a graph showing film thickness vs. number of $O_3$ and HF reaction cycles at 250° C. for $Al_2O_3$, $HfO_2$, $ZrO_2$, $SiO_2$, $Si_3N_4$, and TiN.

FIG. 6 shows results for TiN ALE in the presence of various materials. These results demonstrate the selective etching of TiN using $O_3$ and HF as the reactants at 250° C. There is a negligible thickness changes for $Al_2O_3$, $HfO_2$, $ZrO_2$, $SiO_2$, and $Si_3N_4$ during the TiN ALE reactions. The $O_3$ and HF exposures could not etch the $Al_2O_3$, $HfO_2$, and $ZrO_2$ metal oxides because the fluorides of these metal oxides, $AlF_3$, $HfF_4$, and $ZrF_4$, are stable and nonvolatile. The $O_3$ and HF exposures could also not etch silicon oxide and silicon nitride. In the absence of $H_2O$, dry HF cannot etch $SiO_2$. Previous thermal ALE studies using fluorination and ligand-exchange reactions could also not etch $SiO_2$ or $Si_3N_4$. New approaches are needed for $SiO_2$ ALE and $Si_3N_4$ ALE.

Figure 7:
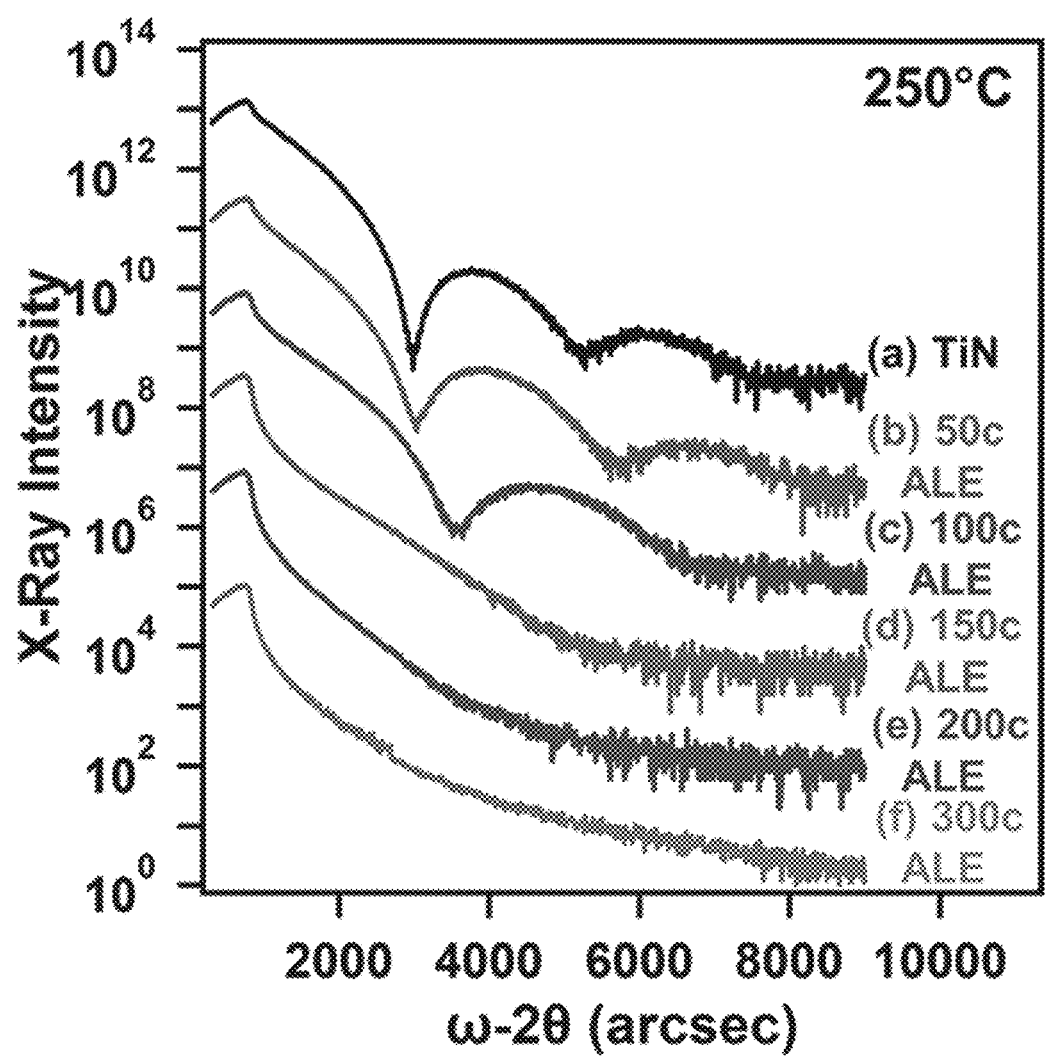
FIG. 7 is a graph showing X-ray reflectivity scans vs. number of $O_3$ and HF reaction cycles on TiN films at 250° C.

FIG. 7 shows XRR scans for the initial TiN film on the Si wafer and for TiN films after various numbers of ALE cycles with $O_3$ and HF as the reactants at 250° C. The initial TiN film thickness is reduced linearly after various numbers of ALE cycles as shown in FIG. 4. The XRR scans also reveal the roughness of the TiN films vs. the ALE cycles. The roughness of initial TiN film was 9.3 Å. The roughness was then reduced as the TiN film was smoothed by the ALE process. The etched TiN films have roughness values of 8.5 Å, 8.2 Å, and 7.5 Å after 25, 50, and 100 ALE cycles, respectively.

Figure 8:
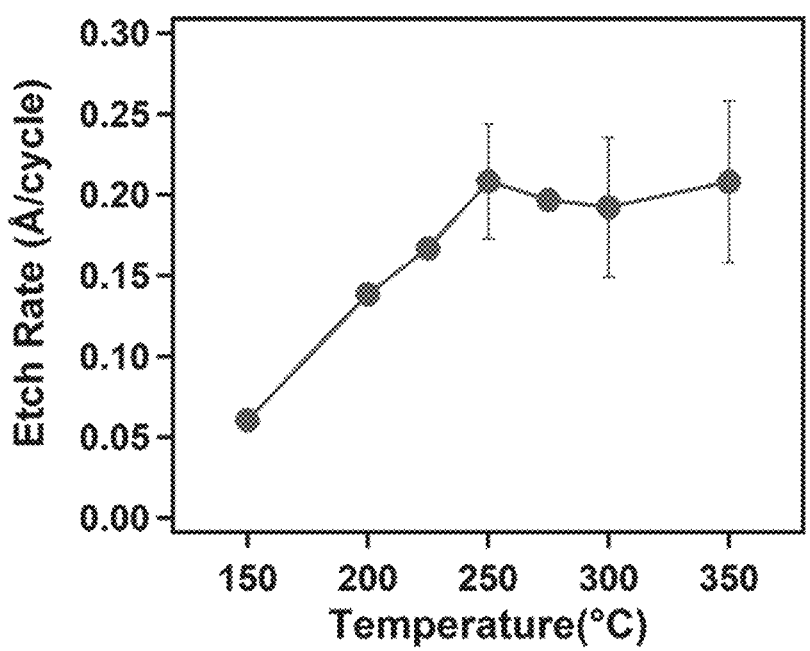
FIG. 8 is a graph showing etch rates for TiN ALE vs. temperature using $O_3$ and HF as the reactants.

FIG. 8 shows the TiN ALE etch rates obtained at different temperatures using $O_3$ and HF as the reactants. The etch rates were obtained by the average of the thickness change measured by SE after 200 ALE cycles. All ALE reactions used an optimized reaction sequence of 3-30-1-30. The etch rate is 0.060 Å/cycle at 150° C. and increases to 0.20 Å/cycle at 250° C. The etch rates are not affected by temperature between 250-350° C. This result may indicate that a similar thickness for the $TiO_2$ layer is formed and removed by $O_3$ and HF at 250-350° C. The HF can only remove the amount of $TiO_2$ that is formed during the $O_3$ exposure. This constant etch rate over a range of temperatures is similar to the "ALD window" often observed for many ALD processes.

Figure 9A:
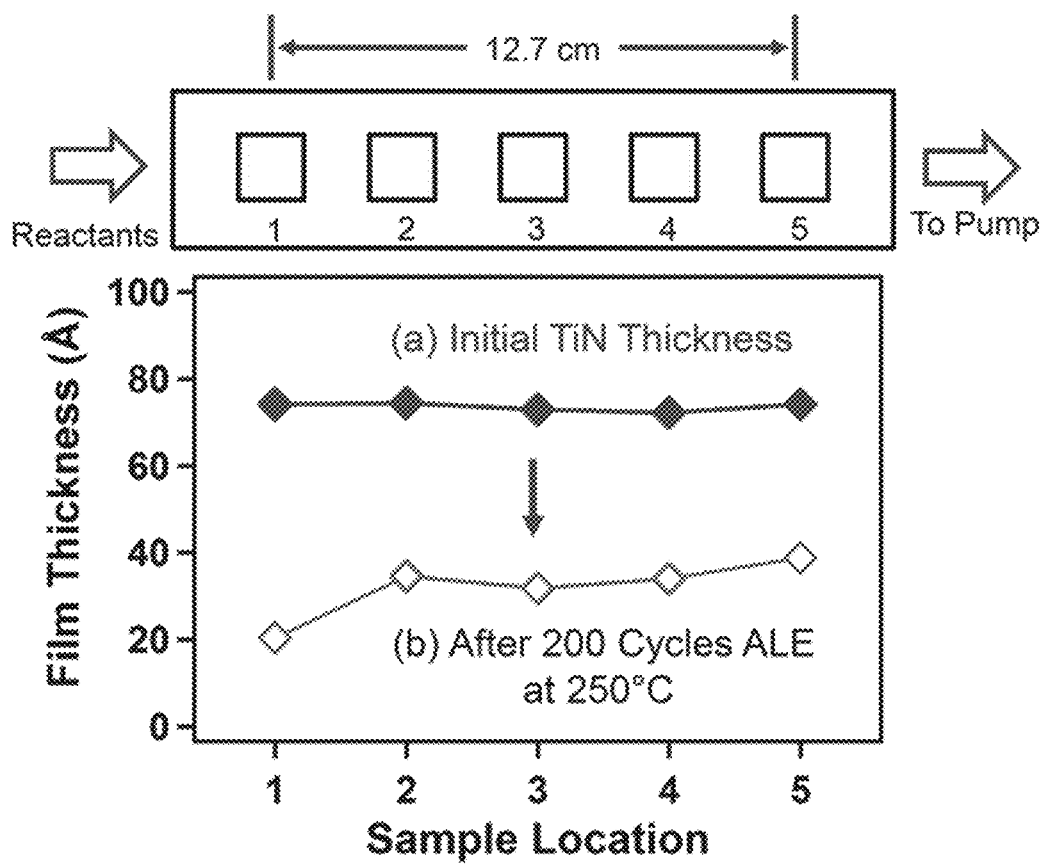
FIG. 9A is a graph showing film thickness for (a, upper line) initial TiN film and (b, lower line) after 200 TiN ALE cycles at 250° C. for different locations in the reactor.

$O_3$ decomposition at high temperatures could affect the uniformity of the TiN film thicknesses in the reactor. To explore this issue, studies were performed after 200 ALE cycles at 250, 300 and 350° C. where the etch rate was nearly constant according to the results in FIG. 8. Five TiN film samples were placed within a length of 12.7 cm in the hot-wall reactor as shown in FIG. 9A. The TiN thicknesses were measured before and after the 200 ALE cycles to determine the uniformity of the TiN film.

FIG. 9A reveals that TiN ALE yielded fairly uniform TiN film thicknesses after 200 ALE cycles at 250° C. Positions 2-5 yield an etch rate of 0.19 Å/cycle. In contrast, a slightly larger etch rate of 0.27 Å/cycle is observed in Position 1 close to the reactant entry into the hot-wall reactor. This slightly larger etch rate may correspond with larger reactant exposures at Position 1.

Figure 9B:
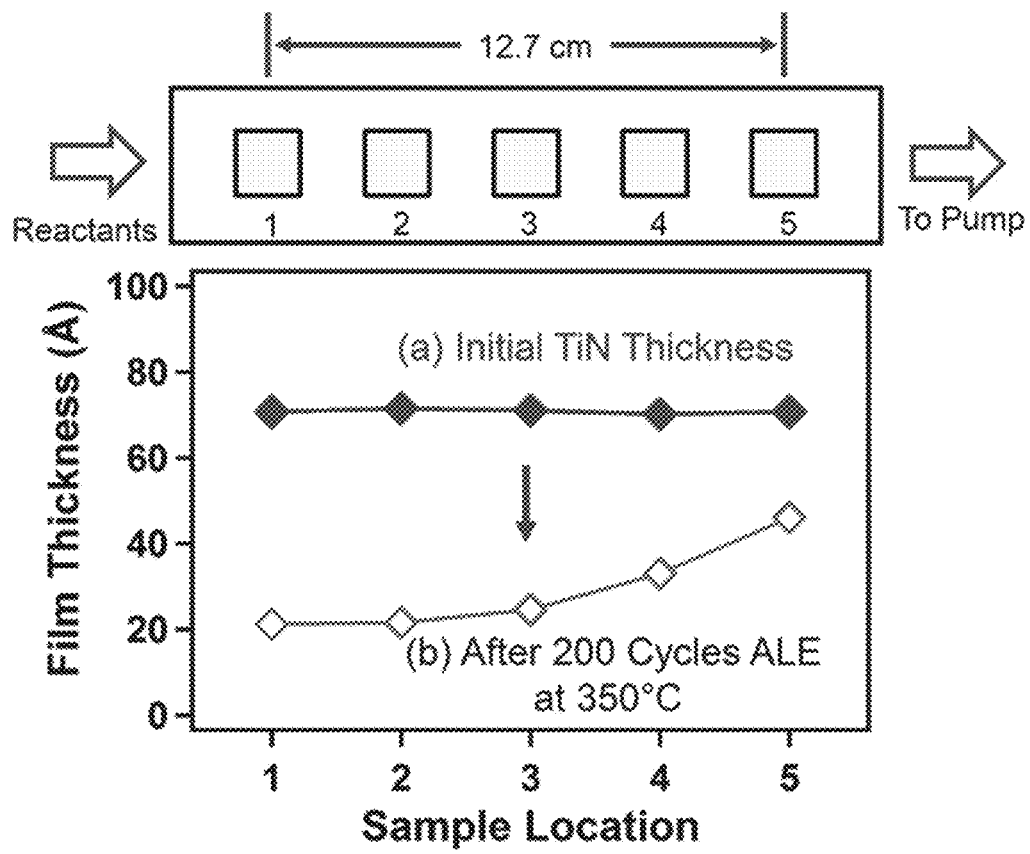
FIG. 9B is a graph showing film thickness for (a, upper line) initial TiN film and (b, lower line) after 200 TiN ALE cycles at 350° C. for different locations in the reactor.

FIG. 9B shows uniformity results obtained at a higher temperature of 350° C. These film thicknesses after 200 ALE cycles indicate that a lower etch rate is observed at the downstream positions furthest from the reactant entry into the hot-wall reactor. A recombination between gaseous $O_3$ molecules is negligible at a reaction pressure of ~1 Torr. Consequently, this result may indicate that $O_3$ is undergoing some decomposition on the surfaces of the hot-wall reactor.

The decomposition of $O_3$ may be accelerated at the high temperature of 350° C. This decomposition may lead to lower $O_3$ concentrations downstream in the reactor. These lower $O_3$ concentrations then produce lower TiN etch rates and thicker TiN film thicknesses. Similar effects were observed for ZnO ALD as a function of position in the reactor using $Zn(CH_2CH_3)_2$ and $O_3$ as the reactants. Thinner ZnO ALD films were observed downstream in the reactor at 200° C. because of the lower $O_3$ concentrations.

Example 3: Thermal TiN ALE Using $H_2O_2$ and HF

Other oxidants in addition to $O_3$ may be able to oxidize the TiN substrate and form a $TiO_2$ layer. $H_2O_2$ is strong oxidizer that has been used as a reactant for metal oxide ALD. $H_2O_2/H_2O$ vapor derived from 30-50 wt. % $H_2O_2$ solution has been used for ALD. $H_2O_2$ is stronger oxidizer than $O_2$, but weaker than $O_3$. The redox potential of oxidants measured in solution is consistent with this order of oxidant strength.

The proposed oxidation reaction of TiN using $H_2O_2$ can be expressed as:

$$TiN(s)+3H_2O_2(g) \rightarrow TiO_2(s)+NO(g)+3H_2O(g) \quad (4)$$

This oxidation reaction is thermochemically favorable. The Gibbs free energy is $\Delta G=-211.6$ kcal/mol at 250° C.

Figure 10:
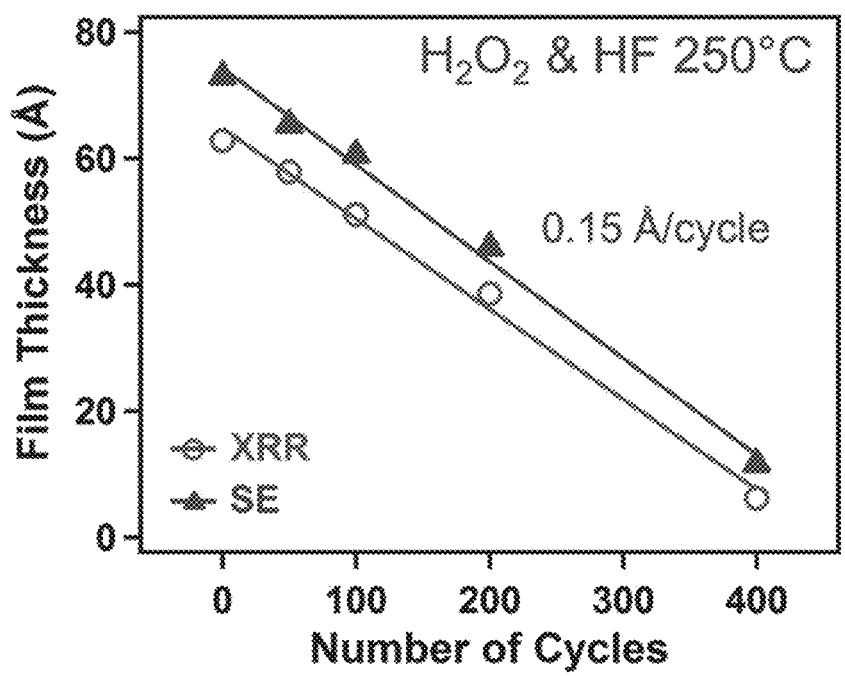
FIG. 10 is a graph showing X-ray reflectivity and spectroscopic ellipsometry measurements of TiN film thickness vs. number of $H_2O_2$ and HF reaction cycles at 250° C.

FIG. 10 shows the SE and XRR measurements of the initial TiN film thickness and the TiN film thickness after 50, 100, 200, and 400 ALE cycles using $H_2O_2$ and HF as the reactants at 250° C. The film thickness vs. the number of ALE cycles is linear. An etch rate of 0.15 Å/cycle was obtained by SE using a least squares fitting. The XRR measurements on the same samples yield an etch rate of 0.14 Å/cycle that is consistent with the SE results.

The ALE reactions using $H_2O_2$ and HF were also self-limiting. However, achieving reproducible results was challenging because of changes in the $H_2O_2$ concentration. Purging the excess $H_2O$ after the $H_2O_2/H_2O$ exposure was also difficult. There may be a thermal decomposition of $H_2O_2$ at high temperatures. These factors contributed to making $H_2O_2$ more problematic than $O_3$ as an oxidant for TiN ALE.

Figure 11:
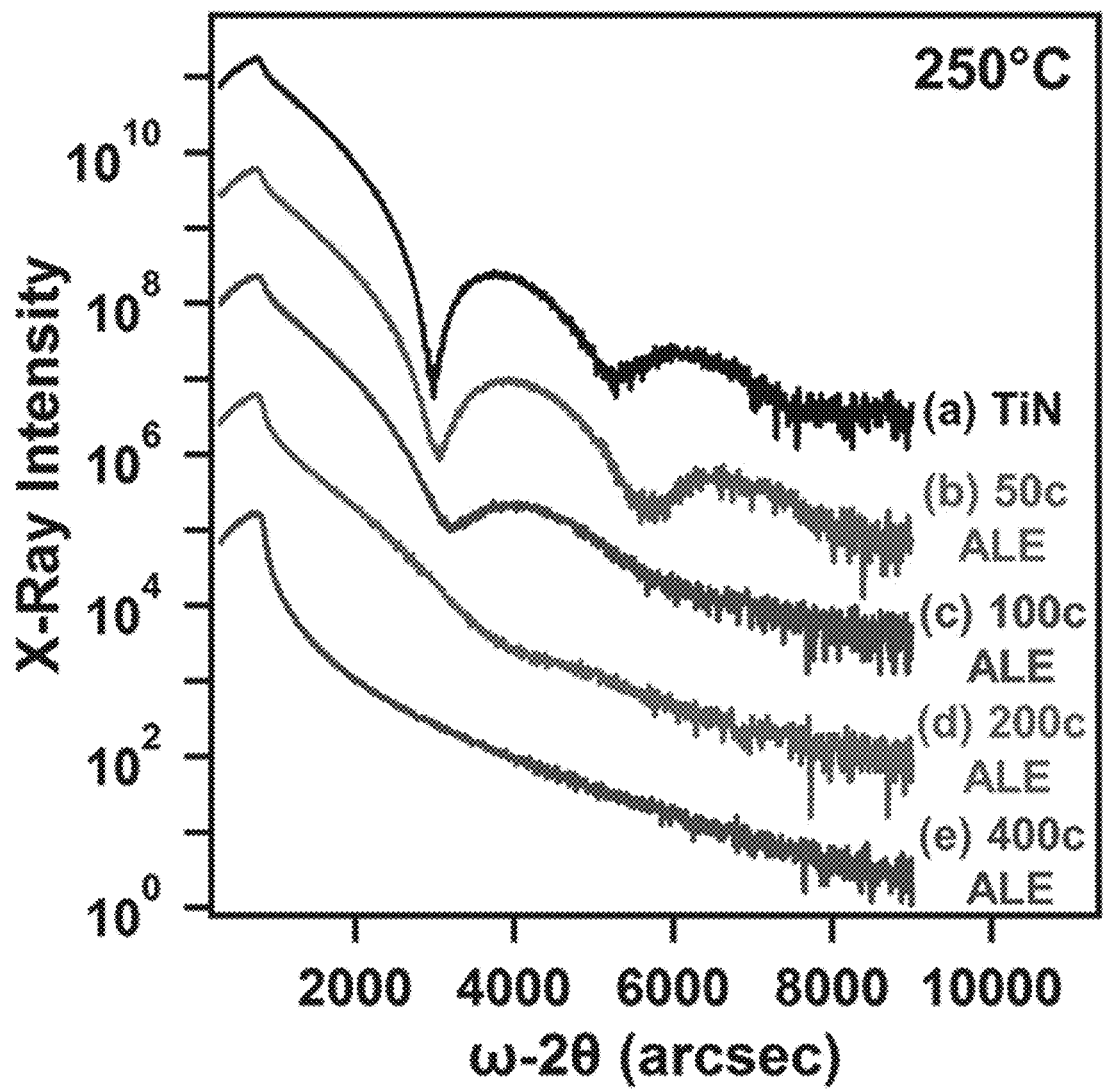
FIG. 11 is a graph showing X-ray reflectivity scans vs. number of $H_2O_2$ and HF reaction cycles on TiN films at 250° C.

FIG. 11 shows the XRR scans of the initial TiN film on the Si wafer and the TiN films after various numbers of ALE cycles using $H_2O_2$ and HF as the reactants at 250° C. The initial TiN film thickness of 63 Å was reduced vs. number of ALE cycles as shown in FIG. 10. The initial TiN film roughness was 9.3 Å. This roughness was reduced gradually to 8.1 Å after 50 cycles and 6.5 Å after 100 ALE cycles. These measurements indicate that the TiN films were smoothed by TiN ALE using $H_2O_2$ and HF as the reactants. These results are consistent with the TiN film smoothing obtained from FIG. 7 during TiN ALE using $O_3$ and HF as the reactants.

Example 4: Generality of Thermal ALE Using Oxidation and Fluorination Reactions

The ALE of other materials including metal nitrides, metal sulfides, metal selenides, and elemental metals should be possible using sequential, self-limiting oxidation and fluorination reactions. This approach requires that oxidation by oxidants, such as $O_3$ and $H_2O_2$, be able to form a self-passivating metal oxide layer with a finite thickness that prevents further oxidation. The fluorination reactants, such as HF and $SF_4$, then remove only the metal oxide layer formed during the oxidation step. The removal occurs because the fluorides produced by the fluorination reactions are volatile. The oxygen in the metal oxide is removed as $H_2O$ and $SO_2$ by HF and $SF_4$, respectively.

ALE processes using oxidation and fluorination reactions for representative materials are given in Table 1. The oxidation reactions for many transition metal nitrides that have volatile metal fluorides, such as TiN, to form their corresponding metal oxides are very favorable. The $\Delta G$ values for the oxidation of TiN, TaN, NbN, VN, $W_2N$, $Mo_2N$, MoN, and CrN using $O_3$ to form $TiO_2$, $Ta_2O_5$, $Nb_2O_5$, $V_2O_5$, $WO_3$, $MoO_3$, $MoO_3$, and $CrO_3$ are −241, −296, −284, −246, −294, −280, −298, and −238 kcal/mol at 250° C., respectively. The $\Delta G$ values for oxidation using $H_2O_2$ are somewhat lower but still very favorable with $\Delta G$ values<−200 kcal/mol.

The fluorination of these metal oxides should all yield volatile metal fluorides. The $\Delta G$ values for the fluorination of $TiO_2$, $Ta_2O_5$, $Nb_2O_5$, $V_2O_5$, $WO_3$, $MoO_3$, and $CrO_3$ using $SF_4$ to form $TiF_4$, $TaF_5$, $NbF_5$, $VF_5$, $WF_6$, $MoF_6$, and $CrF_6$ are −62, −79, −74, −45, −68, −53, and −40 kcal/mol at 250° C., respectively. These metal fluorides are all volatile. $CrF_6$ may rapidly convert to volatile $CrF_5$. For other metal nitrides that do not produce volatile fluorides after the fluorination of the metal oxide, a ligand-exchange reaction may be required to remove the metal fluoride.

Metal carbides are important materials that can be used as gate electrode materials with low work functions in semiconductor devices. Metal carbides have many similar properties to metal nitrides such as structure, bonding characteristics and electronic properties. The oxidation reactions for transition metal carbides to form their corresponding metal oxides are very favorable. The $\Delta G$ values for the oxidation of TaC, VC, and, WC using $O_3$ to form $Ta_2O_5$, $V_2O_5$ and $WO_3$ are −369, −321, −334 kcal/mol at 250° C., respectively. These reactions assume CO as an etching product. The $Ta_2O_5$, $V_2O_5$ and $WO_3$ metal oxides then should produce volatile fluorides during the fluorination reaction using HF or $SF_4$.

Transition metal sulfide and selenide are important 2D semiconductor materials. The oxidation of metal sulfides and selenides to form their corresponding metal oxides are also favorable. The $\Delta G$ values for the oxidation of $WS_2$, $MoS_2$, $WSe_2$, and $MoSe_2$ using $O_3$ to form $WO_3$, $MoO_3$, $WO_3$, $MoO_3$ are −553, −526, −531, and −515 kcal/mol at 250° C., respectively. The oxidation should also yield volatile $SO_2$ or $SeO_3$ reaction products. In addition to these thermochemical calculations, previous studies have recently reported the oxidation of $WSe_2$ to form a $WO_x$ layer on $WSe_2$. These metal oxides should then form volatile metal fluorides after fluorination with $SF_4$.

Elemental metals with volatile metal fluorides can also be etched using oxidation and fluorination reactions. The $\Delta G$ values for the oxidation of Ti, Ta, Nb, V, W, Mo, Cr using $O_3$ to form $TiO_2$, $Ta_2O_5$, $Nb_2O_5$, $V_2O_5$, $WO_3$, $MoO_3$, and $CrO_3$ are −288, −323, −305, −264, −296, −273, and −234 kcal/mol at 250° C., respectively. The oxidation reaction is expected to form a self-passivating metal oxide on the surface of the metal. If the oxide layer does not self-limit vs. oxidant exposure, other milder oxidation reactants such as $NO_2$, $N_2O$, and NO may be useful to obtain a self-limiting oxide thickness. These metal oxides should then form volatile metal fluorides after fluorination with HF or $SF_4$.

The choice of the fluorination reactant is important for metal ALE using oxidation and fluorination reactions. Some metals spontaneously etch with fluorination reactants that are stronger than HF. For example, $XeF_2$ and $F_2$ are both strong fluorination reagents. After removing the metal oxide, $XeF_2$ and $F_2$ could proceed to etch the underlying metal spontaneously. For example, $XeF_2$ spontaneously etches Ti, V, Nb, Ta, Ta, Mo, W, and metal alloys such as Ti/W. In contrast, HF can often etch the metal oxide layer without etching the underlying metal.

Some metals will also be difficult to etch using oxidation and fluorination reactions because their metal oxides are not favorable or stable. For example, Re and Pt have volatile fluorides such as $ReF_6$ and $PtF_6$, respectively. Re ALE may be difficult because the thermochemistry for fluorination of $ReO_3$ is not favorable. The reaction $ReO_3(s)+3/2SF_4(g) \rightarrow ReF_6(g)+3/2SO_2(g)$ has a $\Delta G$ value of +9 kcal/mol at 250° C. and only becomes favorable with a negative $\Delta G$ value at >450° C. Pt ALE may also be difficult because $PtO_3$ is not a stable oxide. The formation of $PtO_2$ on Pt may be possible but $PtF_4$ is not volatile.

TABLE 1

ALE Using Oxidation and Fluorination Reactions for Various Materials at 250° C.

Metal Nitride

Figure 12:
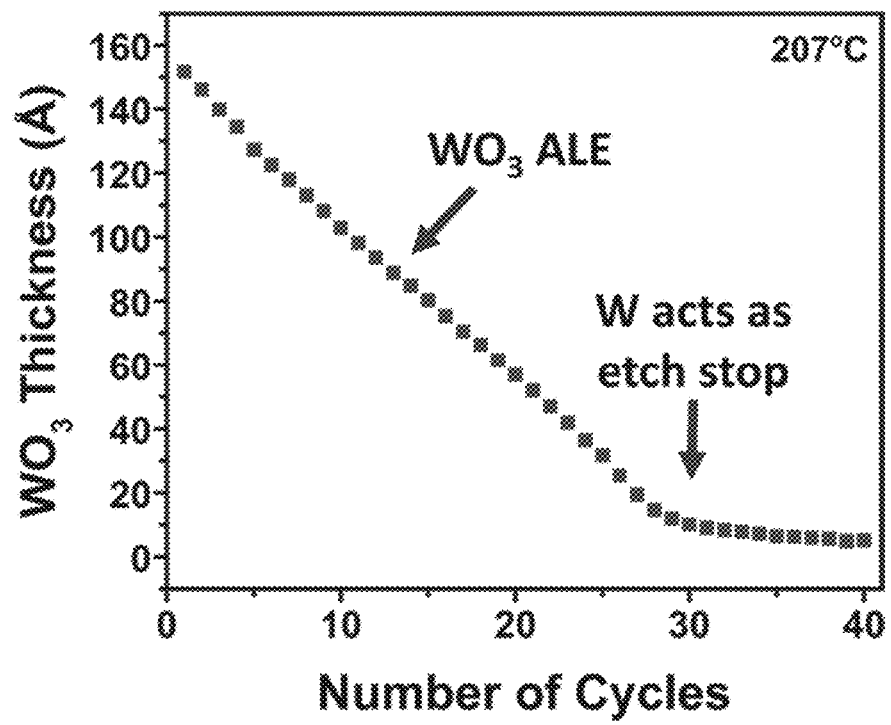
FIG. 12 is a graph showing $WO_3$ thickness vs. number of cycles showing $WO_3$ ALE at 207° C. using $BCl_3$ and HF as reactants. The W film under the $WO_3$ layer acts as an etch stop.

Oxidation: $TiN + 3O_3 \rightarrow TiO_2 + NO + 3O_2$ ($\Delta G = -241$ kcal)
Fluorination: $TiO_2 + SF_4 \rightarrow TiF_4 + SO_2$ ($\Delta G = -62$ kcal)
Overall: $TiN + 3O_3 + SF_4 \rightarrow TiF_4 + SO_2 + 3O_2 + NO$
Metal Carbide Oxidation: $NbC + 7/2O_3 \rightarrow 1/2Nb_2O_5 + CO + 7/2O_2$ ($\Delta G = -353$ kcal)
Fluorination: $1/2Nb_2O_5 + 5/4SF_4 \rightarrow NbF_5 + 5/4SO_2$ ($\Delta G = -74$ kcal)
Overall: $NbC + 7/2O_3 + 5/4 SF_4 \rightarrow NbF_5 + CO + 7/2O_2 + 5/4SO_2$
Metal Sulfide Oxidation: $WS_2 + 7O_3 \rightarrow WO_3 + 2SO_2 + 7O_2$ ($\Delta G = -552$ kcal)
Fluorination: $WO_3 + 3/2SF_4 \rightarrow WF_6 + 3/2SO_2$ ($\Delta G = -68$ kcal)
Overall: $WS_2 + 7O_3 + 3/2SF_4 \rightarrow WF_6 + 7/2SO_2 + 7O_2$
Metal Selenide Oxidation: $MoSe_2 + 9O_3 \rightarrow MoO_3 + 2SeO_3 + 9O_2$ ($\Delta G = -519$ kcal)
Fluorination:: $MoO_3 + 3/2SF_4 \rightarrow MoF_6 + 3/2SO_2$ ($\Delta G = -43$ kcal)
Overall: $MoSe_2 + 9O_3 + 3/2SF_4 \rightarrow MoF_6 + 2SeO_3 + 9O_2 + 3/2SO_2$
Elemental Metal Oxidation: $Ta + 5/2O_3 \rightarrow 1/2Ta_2O_5 + 5/2O_2$ ($\Delta G = -323$ kcal)
Fluorination: $1/2Ta_2O_5 + 5/4SF_4 \rightarrow TaF_5 + 5/4SO_2$ ($\Delta G = -79$ kcal)
Overall: $Ta + 5/2O_3 + 5/4SF_4 \rightarrow TaF_5 + 5/2O_2 + 5/4SO_2$ Example 5: $WO_3$ ALE Using "Conversion-Fluorination" with $BCl_3$ and HF FIG. 12 shows the $WO_3$ layer thickness measured using in situ SE during the etching of the $WO_3$ layer on the W film. These results were obtained using an AB exposure sequence with BCl3 and HF as the reactants. FIG. 12 displays results for 40 reaction cycles at a substrate temperature at 207° C. The initial $WO_3$ film thickness is □150 Å. The $WO_3$ film thickness decreases linearly until reaching a $WO_3$ film thickness of □10 Å. The etching of the $WO_3$ layer is linear over this range of thicknesses with an etch rate of 4.18 Å/cycle. The SE measurements confirmed that there was no change in the underlying W film thickness during $WO_3$ etching. The $WO_3$ etch rate is reduced dramatically when the $WO_3$ layer reaches a thickness of □10 Å. At this point, the $WO_3$/W interface is nearby and the $WO_3$ layer may undergo a transition to WO, oxides where x<3 before reaching the underlying W film. These WO, oxides may not be amenable to the "conversion-etch" procedure using $BCl_3$ and HF. As a result, the etch rate slows when the tungsten oxide layer thickness reaches a thickness of □5 Å. The underlying W film acts as an etch stop because the W film is not etched by the sequential exposures of $BCl_3$ and HF.

Figure 13:
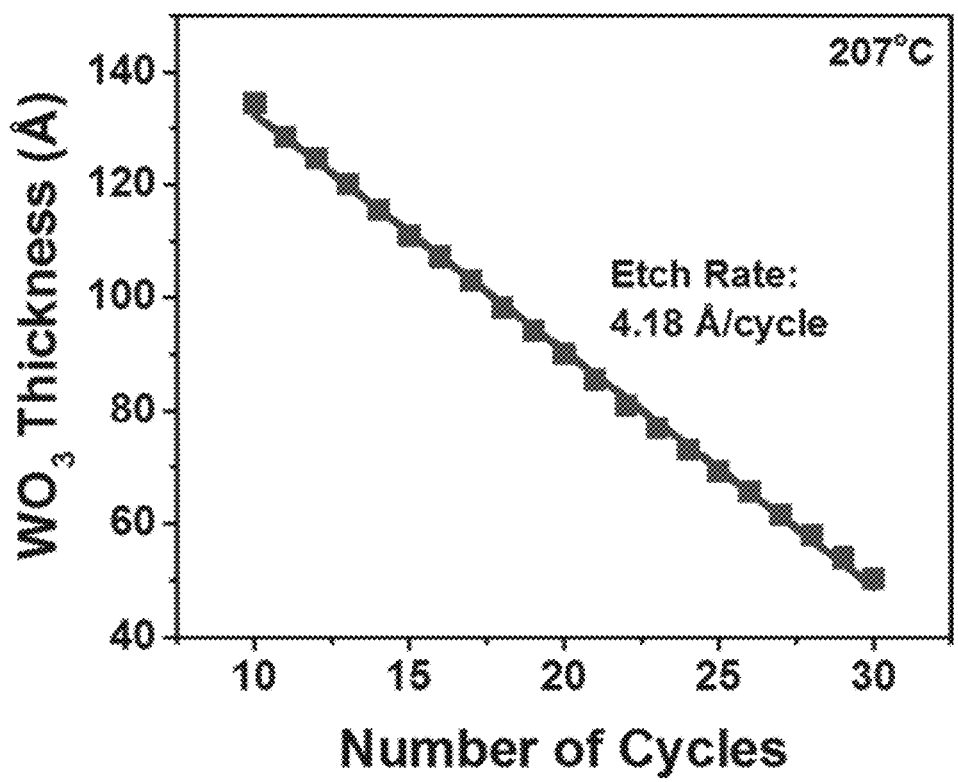
FIG. 13 is a graph showing $WO_3$ thickness vs. number of cycles showing $WO_3$ ALE at 207° C. using $BCl_3$ and HF as reactants. Etch rate during $WO_3$ ALE is 4.18 Å/cycle.

FIG. 13 shows the $WO_3$ thickness vs. number of $BCl_3$ and HF cycles at 207° C. for 20 cycles. The $BCl_3$ exposures were 325 mTorr s. The maximum $BCl_3$ pressure during these exposures was □40 mTorr. The HF exposures were 200 mTorr s. The maximum HF pressure during these exposures was □60 mTorr. Each dose was followed by an UHP $N_2$ purge lasting 130 s. The data points in FIG. 13 show the individual SE measurements of the $WO_3$ thickness after each reaction cycle.

The etching of $WO_3$ is linear with an R2 value of 0.999. The $WO_3$ etch rate is 4.18 Å/cycle. Multiple measurements of $WO_3$ ALE at 207° C. yielded etch rates that varied from 3.98-4.44 Å/cycle. Crystalline $WO_3$ has a monoclinic structure with cell dimensions of a=7.306 Å, b=7.540 Å, and c=7.692 Å. The $WO_3$ etch rate is slightly more than one-half of the $WO_3$ unit cell lengths. The etching of $WO_3$ by $BCl_3$ and HF occurs by the "conversion-fluorination" mechanism where $BCl_3$ converts the $WO_3$ surface layer to a $B_2O_3$ layer. During the conversion of $WO_3$ to $B_2O_3$, the likely reaction product is a volatile $WO_xCl_y$ compound. HF can then spontaneously remove the $B_2O_3$ layer by forming $BF_3$ and $H_2O$ as reaction products. The removal of $B_2O_3$ regenerates the original $WO_3$ surface and completes one $BCl_3$/HF reaction cycle. The conversion of $WO_3$ to $B_2O_3$ is driven by the higher stability of $B_2O_3$ as compared to $WO_3$. The etching of $B_2O_3$ by HF occurs because both $BF_3$ and $H_2O$ are volatile reaction products.

Figure 14:
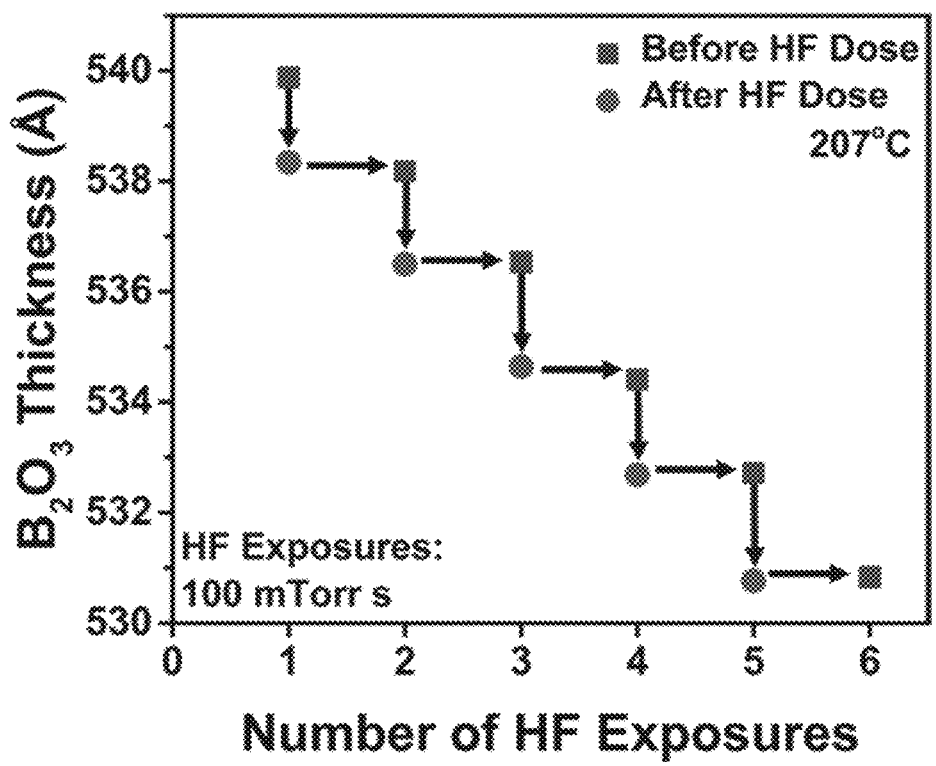
FIG. 14 is a graph showing $B_2O_3$ thickness vs. number of HF exposures showing spontaneous etching of $B_2O_3$ film at 207° C. HF exposure was 100 mTorr s, and $B_2O_3$ etch rate is ~2 Å per HF exposure.

To prove that $B_2O_3$ can be spontaneously etched by HF, $B_2O_3$ films were grown with $BCl_3$ and $H_2O$ at 20° C. This method was adapted from the previously reported $B_2O_3$ ALD process with $BBr_3$ and $H_2O$ as the reactants at 20° C. $B_2O_3$ films were grown using 600 cycles of $BCl_3$ and $H_2O$ at 20° C. This $B_2O_3$ ALD process led to $B_2O_3$ films with a thickness of □580 Å. X-ray photoelectron spectroscopy (XPS) analysis of these films was consistent with stoichiometric $B_2O_3$ films. The $B_2O_3$ films were then heated to 207° C. for the HF exposures. The $B_2O_3$ ALD films were exposed to HF pressures of 100 mTorr for 1 s. SE measurements were performed 60 s after the initial HF exposure. The SE measurements were then repeated 12 min after the first measurements to verify that no further etching occurred without additional HF exposures. FIG. 14 shows the $B_2O_3$ film thickness vs. the number of HF exposures for six HF exposures. Each HF exposure removes □2 Å of the $B_2O_3$ film. The second scan recorded after 12 min confirms that no additional etching is observed in the absence of HF exposures. These experiments demonstrate that HF can spontaneously etch the $B_2O_3$ film. The $B_2O_3$ etching is dependent on the HF pressure and the HF exposure time. The spontaneous $B_2O_3$ etching will continue for at least 20-30 HF exposures.

Figure 15A:
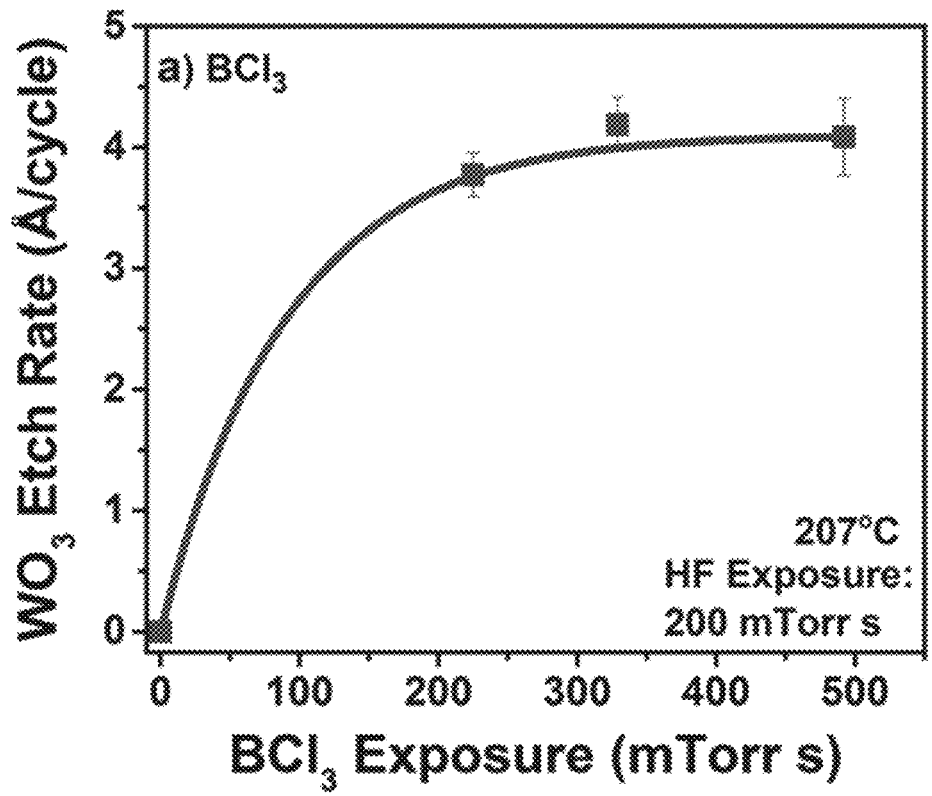
FIGS. 15A-15B are graphs showing $WO_3$ etch rate vs. reactant exposure during $WO_3$ ALE at 207° C.
Figure 15B:
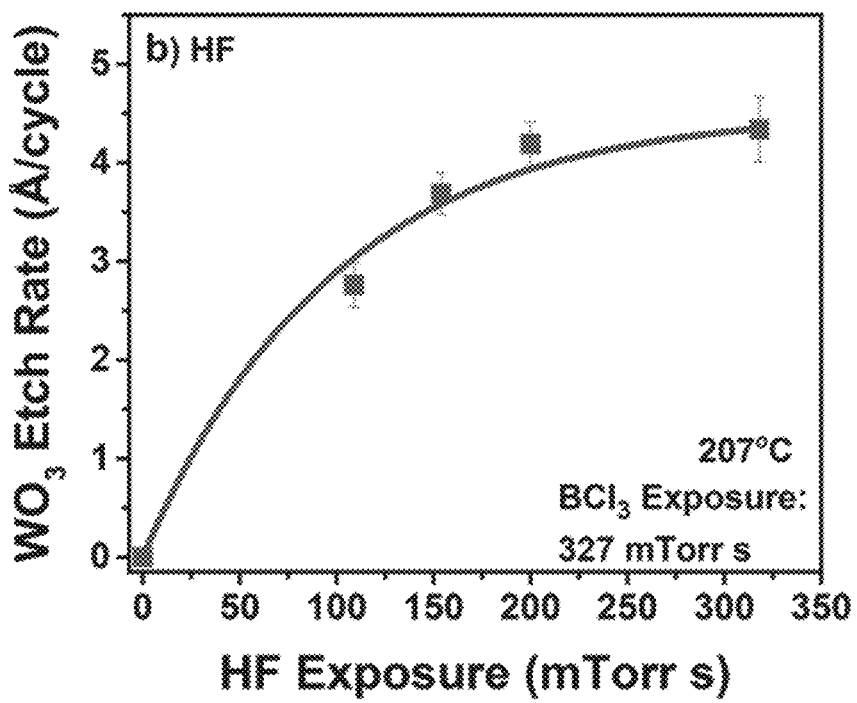

Both $BCl_3$ and HF exposures are required for $WO_3$ etching. Without HF exposures, $BCl_3$ exposures alone cannot etch $WO_3$. Without $BCl_3$ exposures, HF exposures alone did not etch $WO_3$. FIGS. 15A-15B examine the self-limiting $BCl_3$ and HF reactions during $WO_3$ ALE at 207° C. The etch rates were determined by varying one reactant while holding the other reactant at a constant reactant exposure. Each precursor was dosed into a stream of UHP $N_2$ gas at a pressure of 1180 mTorr. The purge time after each reactant exposure was 130 s. The self-limiting behavior for the $WO_3$ etch rate vs. the $BCl_3$ exposure is shown in FIG. 15A. The $BCl_3$ exposures were varied from 0 to 492 mTorr s. The HF exposures were held constant at 200 mTorr s. Increasing the $BCl_3$ exposure to >225 mTorr s did not produce significantly more $WO_3$ etching. The $BCl_3$ reaction with $WO_3$ is self-limiting at the larger $BCl_3$ exposures with an etch rate of ▭4.2 Å/cycle.

The self-limiting behavior of the HF exposure is shown in FIG. 15B. The HF exposure was varied from 0 to 318 mTorr s. $BCl_3$ exposures were held constant at 327 mTorr s. The $WO_3$ etch rate increases progressively vs. HF exposure. Increasing the HF exposure to >200 mTorr s did not produce significantly more $WO_3$ etching. The HF reaction with $WO_3$ is self-limiting at larger HF exposures with an etch rate of ▭4.2 Å/cycle.

Figure 16:
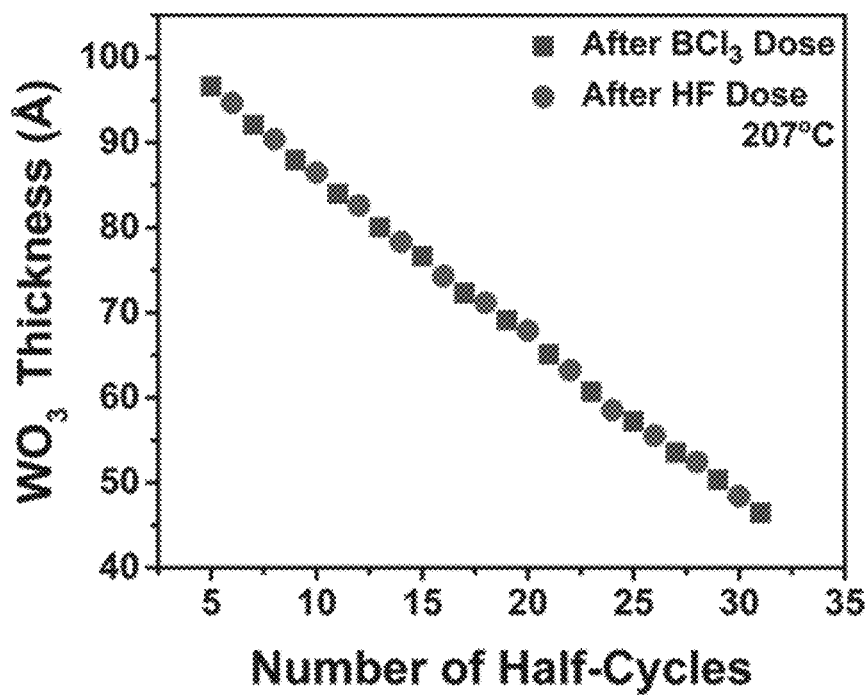
FIG. 16 is a graph showing $WO_3$ thickness vs. number of half-cycles during $WO_3$ ALE at 207° C. under self-limiting conditions.
Figure 17:
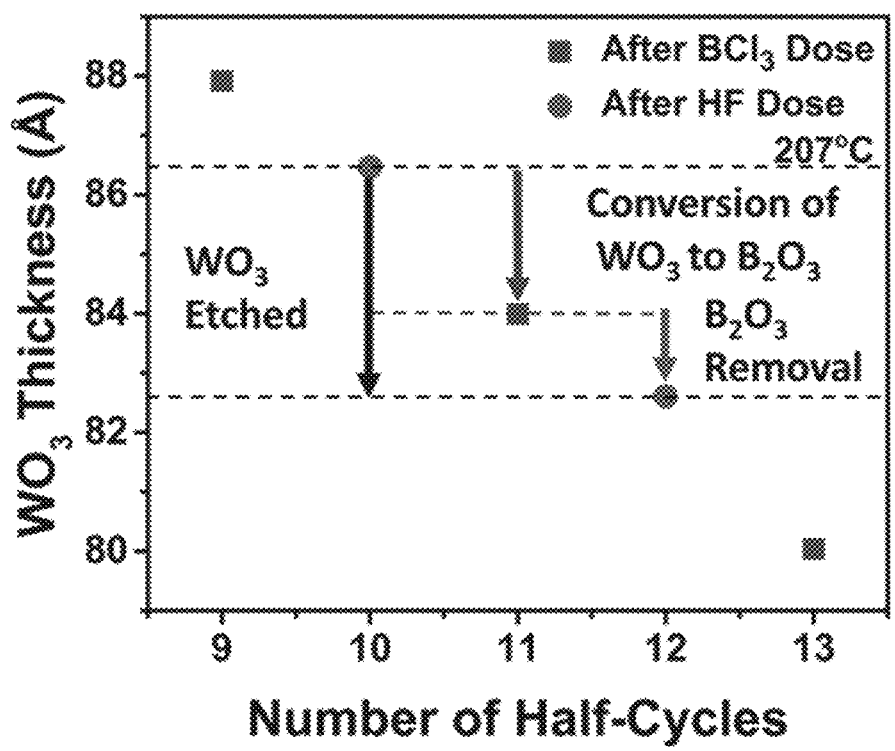
FIG. 17 is a graph showing an analysis of $WO_3$ thickness change after $BCl_3$ exposure and HF exposure during $WO_3$ ALE at 207° C.

FIG. 16 shows SE measurements that were recorded after each $BCl_3$ and HF exposure during $WO_3$ ALE at 207° C. for 26 half-cycles. The $WO_3$ thickness decreases linearly with the number of half-cycles. An expansion of the $WO_3$ thickness vs. number of half-cycles for four half-cycles is displayed in FIG. 17. The SE model assumed that the entire film was $WO_3$. Adding a Cauchy layer to account for the $B_2O_3$ layer on the $WO_3$ film after the $BCl_3$ conversion reaction did not improve the SE fitting. FIG. 17 indicates that the $WO_3$ thickness etched in one $BCl_3$/HF cycle is 4.29 Å. The thickness loss after the $BCl_3$ exposure is 2.99 Å. The thickness loss after the HF exposure is 1.30 Å.

The $WO_3$ thickness loss of 4.29 Å during one complete cycle represents $1.32 \times 10^{-9}$ $WO_3$ mol/cm² based on a $WO_3$ density of 7.16 g/cm³ and a $WO_3$ molar mass of 231.8 g/mol. During the $WO_3$ etching, $WO_3$ can be converted to various amounts of $B_2O_3$ depending on the possible $BCl_3$ conversion reactions given by Equations 18, 19 and 20. The thickness loss of 2.99 Å after the $BCl_3$ exposure leaves a $B_2O_3$ thickness of 1.30 Å on the surface. The SE modeling assumes that the $B_2O_3$ thickness can be modeled as indistinguishable from a $WO_3$ thickness. This $B_2O_3$ thickness is then removed by the subsequent HF exposure.

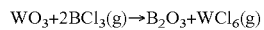

$\Delta G^0(200° C.) = -7.7$ kcal/mol

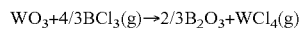

$\Delta G^0(200° C.) = -4.3$ kcal/mol (18)

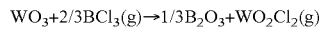

$\Delta G^0(200° C.) = -7.8$ kcal/mol (20)

The $B_2O_3$ thickness of 1.30 Å on the surface prior to removal by HF is in agreement with the $BCl_3$ conversion reaction given by eq 5. This $BCl_3$ conversion reaction yields $WO_2Cl_2$ as the volatile reaction product. On the basis of eq 5, the predicted $B_2O_3$ thickness remaining on the surface after the conversion of 4.29 Å of $WO_3$ or $1.32 \times 10^{-9}$ $WO_3$ mol/cm² is 1.25 Å. The predicted $B_2O_3$ thickness of 1.25 Å agrees well with the measured B2O3 thickness of 1.30 Å. Mass spectrometry studies are needed to confirm $WO_2Cl_2$ as the volatile reaction product.

Figure 18:
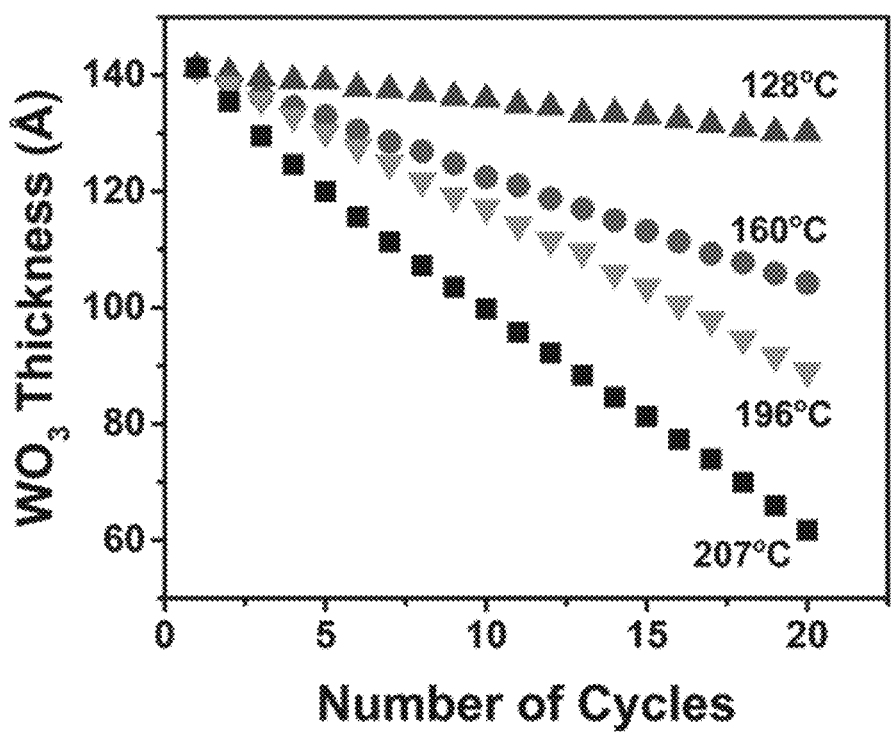
FIG. 18 is a graph showing $WO_3$ thickness vs. number of cycles for $WO_3$ ALE at 128° C., 160° C., 196° C. and 207° C.

The $WO_3$ film thicknesses vs. number of $BCl_3$ and HF reaction cycles at different substrate temperatures are shown in FIG. 18. The self-limiting reaction conditions at 207° C. were used for all of the various temperatures. The self-limiting conditions were a $BCl_3$ exposure of 325 mTorr s and an HF exposure of 200 mTorr s. All of the initial $WO_3$ thicknesses were referenced to a starting value of 140 Å to compare the results at 128, 160, 196, and 207° C. For all of the temperatures, the $WO_3$ etching is linear with the number of reaction cycles. The etch rate also increases at higher temperatures. The etch rates are 0.55, 2.04, 2.95, and 4.19 Å/cycle at 128, 160, 196, and 207° C., respectively.

Figure 19:
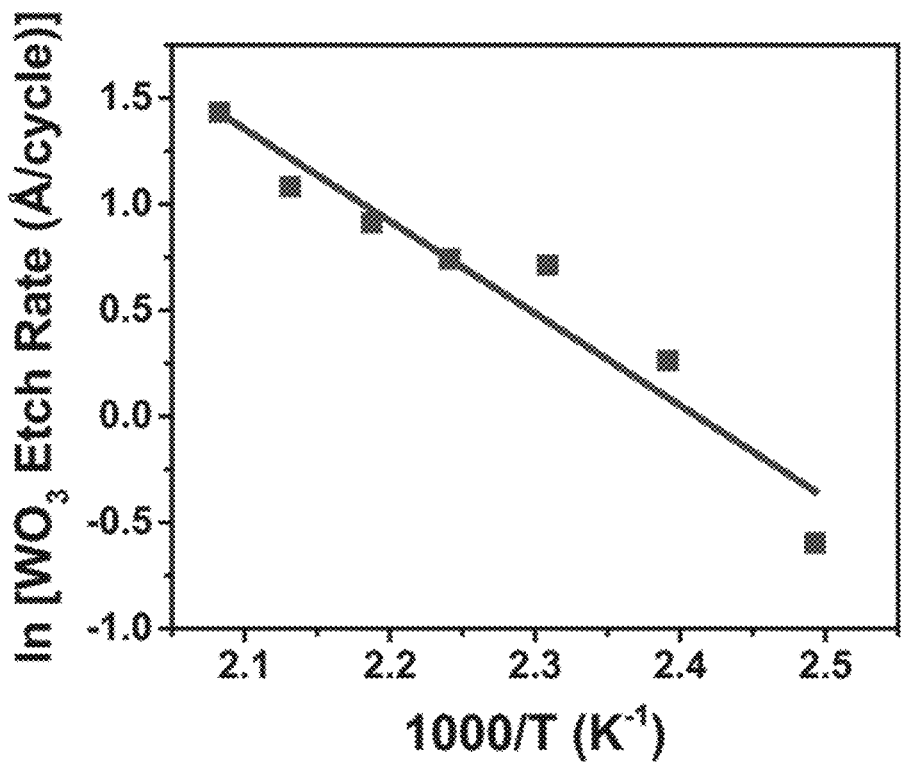
FIG. 19 is an Arrhenius plot of temperature-dependent etch rates for $WO_3$ ALE. Slope of the Arrhenius plot yields an activation barrier of 8.6 kcal/mol.

FIG. 19 shows an Arrhenius plot of all of the etch rates at different temperatures acquired from the SE measurements. The approximately linear plot of ln(etch rate) vs. 1/T shows that the etch rates are nearly exponentially dependent on temperature. The temperature-dependent $WO_3$ etch rate exhibits an activation energy of 8.6 kcal/mol. The temperature dependence of the $WO_3$ etch rate provides a means to control the $WO_3$ etch rate.

Example 6: W ALE Using
"Oxidation-Conversion-Fluorination" with $O_3$, $BCl_3$ and HF The development of $WO_3$ ALE opens a pathway to W ALE. Tungsten can first be oxidized to $WO_3$. Subsequently, $WO_3$ can be etched using sequential $BCl_3$ and HF exposures as described in Example 5. The oxidation of W to produce $WO_3$ must be self-limiting to obtain atomic layer control of W etching. This requirement is demanding because oxidation of metals is generally very favorable, and often the oxidation can extend deep into the initial metal.

Tungsten oxidation has been studied extensively over a variety of temperatures and oxidation conditions. Many investigations have been reported at high temperatures >500° C. where tungsten oxidizes readily to form $WO_3$ and other tungsten oxides. At temperatures >800° C., these oxides can also desorb into the gas phase. At temperatures between 300 and 400° C., tungsten is oxidized by $O_2$ to form a $WO_3$ layer with thicknesses of 10-50 nm. The $WO_3$ layer acts as a diffusion barrier that limits further oxidation.

At lower temperatures of <300° C., the tungsten oxidation is limited to thin $WO_3$ films on the W substrate. Oxide thicknesses of 10-16 Å have been reported after $O_2$ exposures on polycrystalline W substrates for 1 h at 23-200° C. Somewhat thicker oxide thicknesses have been measured when using $O_2$ plasmas to oxidize tungsten at lower temperatures. Tungsten oxidation at these lower temperatures is compatible with the temperature for $WO_3$ ALE and also is self-limiting at thin film thicknesses that are required for an ALE process.

Figure 20:
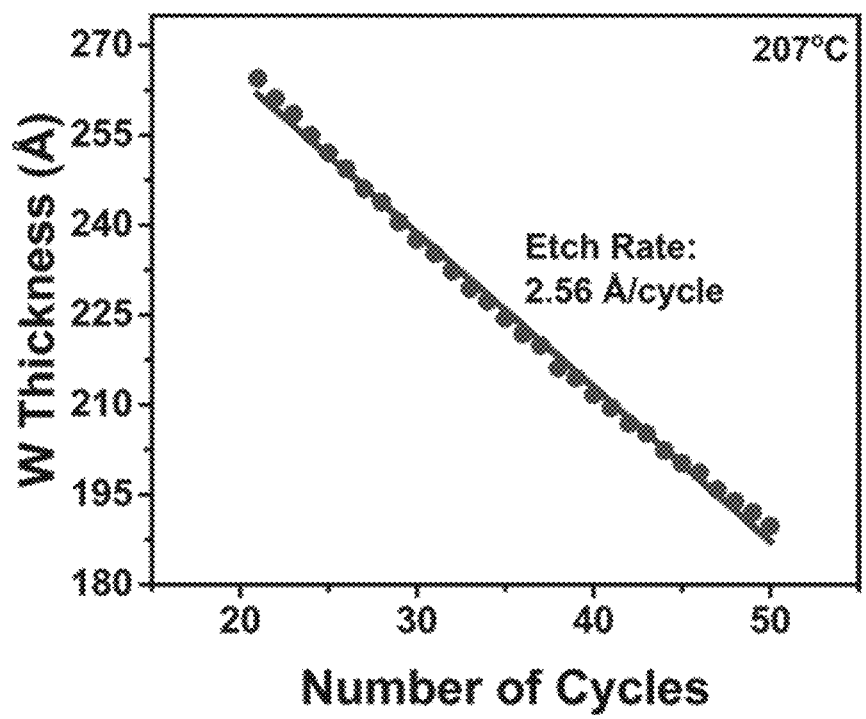
FIG. 20 is a graph of W thickness vs. number of cycles during W ALE at 207° C. using $O_2/O_3$, $BCl_3$, and HF as reactants. Etch rate during W ALE is 2.56 Å/cycle.

FIG. 20 shows results for the tungsten thickness vs. number of ABC reaction cycles during W ALE at 207° C. In these experiments, the surface of the W film was oxidized to $WO_3$ using $O_2/O_3$ pressures of 70 mTorr. The $WO_3$ layer was then etched using the next $BCl_3$ and HF exposures. The W ALE was conducted under self-limiting conditions for the $O_2/O_3$, $BCl_3$, and HF reactions at 207° C. as discussed below. The $O_2/O_3$ exposure was 3150 mTorr s, the $BCl_3$ exposure was 329 mTorr s, and the HF exposure was 2800 mTorr s.

FIG. 20 reveals that the tungsten film thickness decreases linearly vs. the number of cycles. The etch rate is 2.56 Å/cycle, and the $R^2$ value of the linear fit is 0.996. Multiple SE measurements of W ALE at 207° C. yielded etch rates that varied from 2.35-2.56 Å/cycle. XRR measurements confirmed the SE measurements. The W etch rate at 207° C. is slightly less than one unit cell length. W has a body-centered cubic structure with a unit cell length of 3.19 Å.

Figure 21A:
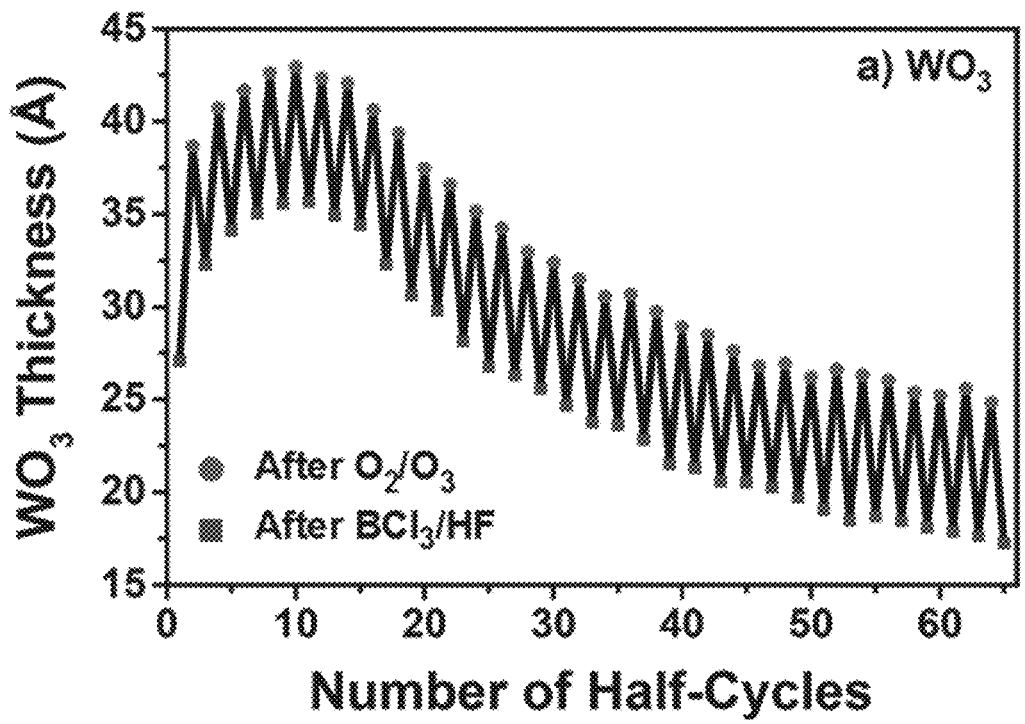
FIGS. 21A-21B are graphs showing $WO_3$ and W thicknesses vs. number of half-cycles during W ALE under self-limiting conditions using $O_2/O_3$, $BCl_3$, and HF as reactants at 207° C.
Figure 21B:
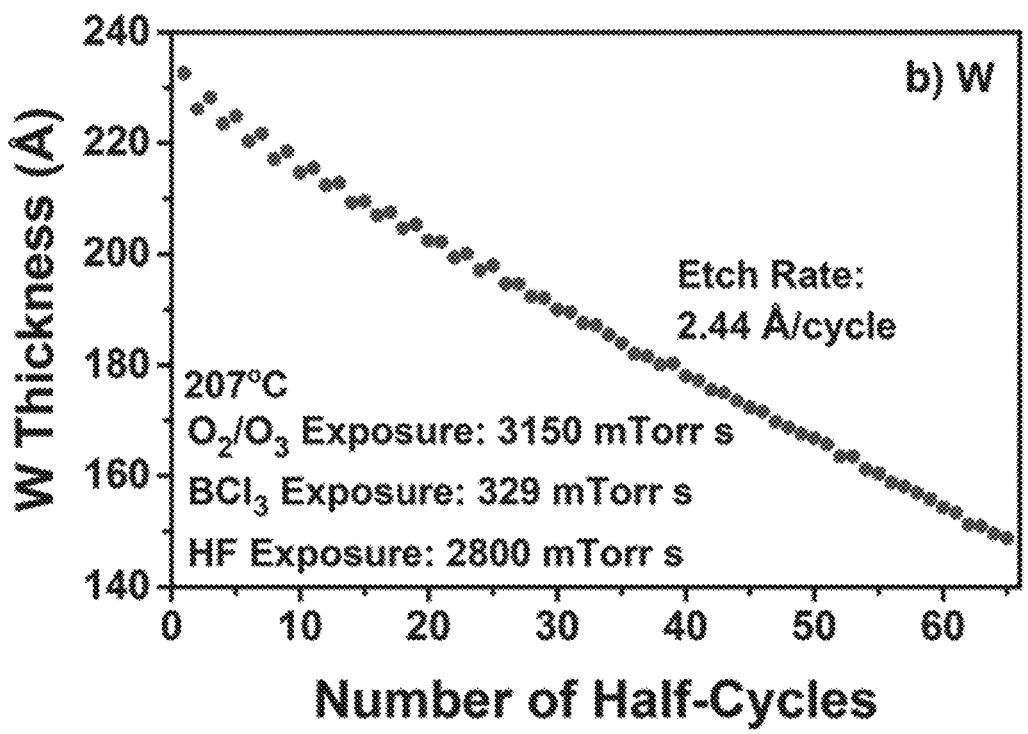

The $WO_3$ and W layer thicknesses could be determined simultaneously using SE measurements during W ALE. FIGS. 21A-21B show the concurrent SE measurements of the $WO_3$ and W film thicknesses vs. the number of half-cycles at 207° C. The half-cycles are the $O_2/O_3$ oxidation reaction and the $BCl_3$/HF etching reaction. The $O_2$/$O_3$ exposure was 3150 mTorr s, the $BCl_3$ exposure was 329 mTorr s, and the HF exposure was 2800 mTorr s. The ellipsometry measurements were performed after each half-cycle. The SE measurements were able to monitor both the growth and etching of the $WO_3$ layer and the concurrent removal of the underlying W film.

With an ABC exposure sequence, the $WO_3$ thickness is increased during W oxidization by $O_2$/$O_3$ and then decreased during the $BCl_3$ and HF etching reactions. The oxidation and etching leads to an oscillatory $WO_3$ thickness in FIG. 21A vs. the number of half-cycles. The increase in the $WO_3$ thickness from oxidation is 7.2 Å/half-cycle averaged over five random half-cycles after 12 half-cycles. The decrease in the $WO_3$ thickness from the $BCl_3$/HF etching is 7.7 Å/half-cycle averaged over five random half-cycles after 12 half-cycles.

The $WO_3$ thickness loss of ~7.7 Å after the $BCl_3$/HF reactions during W ALE at 207° C. is larger than the $WO_3$ thickness loss of ~4.2 Å/cycle during $WO_3$ ALE at 207° C. $WO_3$ ALE is performed with $BCl_3$ and HF as the reactants. W ALE is performed with $O_2$/$O_3$, $BCl_3$, and HF as the reactants. The addition of the $O_2$/$O_3$ exposure may alter the surface species and affect the $BCl_3$/HF reactions. Additional experiments were conducted where $O_2$/$O_3$ was removed from the ABC exposure sequence and $WO_3$ ALE was performed on $WO_3$ films produced using $O_2$/$O_3$. These experiments observed a $WO_3$ etch rate of ~4.2 Å/cycle that is the same as the etch rate of ~4.2 Å/cycle for $WO_3$ films produced using an $O_2$ plasma. The $WO_3$ etching is not dependent on the oxidant used to form the $WO_3$ film.

FIG. 21A also observes an increase in the $WO_3$ thickness from ~30 to ~40 Å during the first 10 half-cycles. This increase is followed by a reduction to an oxide thickness of ~20 Å after 60 half-cycles. The change in the $WO_3$ thickness results from the competition between $WO_3$ growth during the $O_2$/$O_3$ exposures and $WO_3$ etching during the $BCl_3$/HF reactions. Higher or lower $O_2$/$O_3$ exposures were observed to result in more or less $WO_3$ growth. The presence of a maximum $WO_3$ thickness after 10 half-cycles in FIG. 21A may be related to nucleation effects combined with the competition between $WO_3$ growth and $WO_3$ etching.

Concurrent ellipsometry measurements of the W thickness are shown in FIG. 21B. While the $WO_3$ thickness is oscillating during the oxidation and etching half-cycles, the W thickness is reduced linearly vs. number of half-cycles. The W etching rate is 2.44 Å/cycle. A small oscillation of the W thickness was observed over the first 30 half-cycles. The decreases in the W thickness during the half-cycles occur after the $O_2$/$O_3$ exposures when W is oxidized to $WO_3$. This slight oscillation may be an artifact from the ellipsometric modeling.

Figure 22:
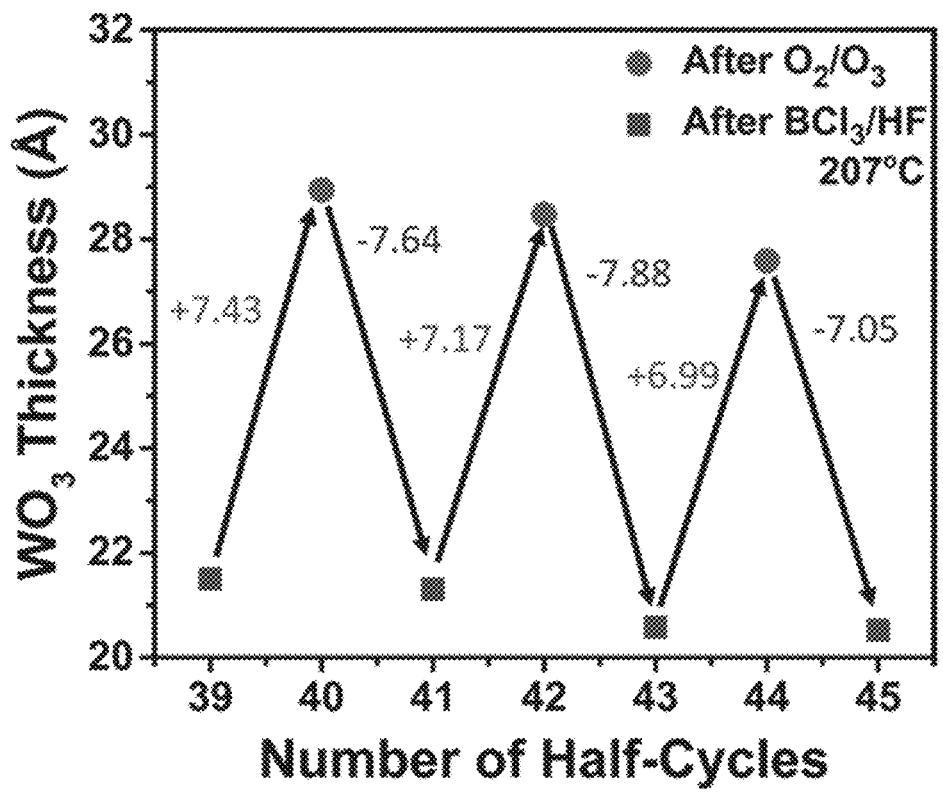
FIG. 22 is a graph showing enlargement of $WO_3$ thickness vs. number of half-cycles showing increase and decrease of $WO_3$ thickness after $O_2/O_3$ exposure and $BCl_3$/HF reaction.

An expansion of the oscillation in the $WO_3$ thickness in FIG. 21A is shown in FIG. 22. The increase of the $WO_3$ thickness during oxidation and the reduction of the $WO3$ thickness during etching for six consecutive half-cycles are dramatic. Values of the individual $WO_3$ thickness increases and decreases are given in FIG. 22. In addition, the increase in the $WO_3$ thickness from oxidation is 7.2 Å/half-cycle averaged over five random half-cycles after 12 half-cycles in FIG. 21A. The decrease in the $WO_3$ thickness from the $BCl_3$/HF etching is 7.7 Å/half-cycle averaged over five random half-cycles after 12 half-cycles in FIG. 21A. The ratio of the $WO_3$ thickness gain per half-cycle and the W thickness loss per cycle should be equal to the ratio of the $WO_3$ and W molar volumes. This expectation is based on conservation of tungsten mass where a W loss must equal a $WO_3$ gain. The ratio of the $WO_3$ gain and W loss is 7.2 (Å/half-cycle)/2.44 (Å/cycle)=2.95. In comparison, the ratio of the molar volumes for $WO_3$ and W is (32.4 $cm^3$/mol)/(9.5 $cm^3$/mol)=3.4.

The ratio of the molar volumes is only slightly higher than the ratio of the etch rates. This reasonable agreement is confirmation that W ALE occurs by conversion of W to $WO_3$ followed by the etching of $WO_3$. The slight differences in the ratios may also be explained by some $WO_2$ in the tungsten oxide layer. As compared to $WO_3$, $WO_2$ has a smaller molar volume of 20.0 $cm^3$/mol. The molar volume of a mixture of $WO_3$/$WO_2$ would lower the ratio of the molar volumes for $WO_3$/$WO_2$ and W. The self-limiting nature of the $O_2$/$O_3$, $BCl_3$, and HF reactions is critical to establish a W ALE process. Self-limiting $BCl_3$ and HF reactions have already been established during the characterization of $WO_3$ ALE as shown in FIG. 15. The self-limiting behavior of the $O_2$/$O_3$, $BCl_3$, and HF reactions during W ALE also needs to be verified to confirm a self-limiting procedure for W ALE.

Figure 23:
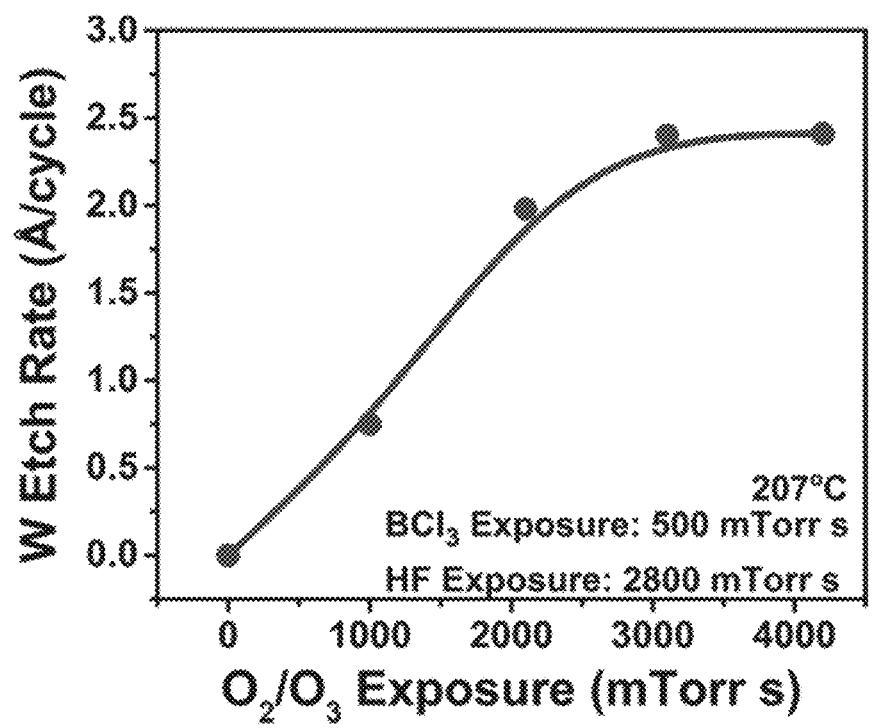
FIG. 23 is a graph showing W etch rate vs. $O_2/O_3$ exposure during W ALE at 207° C. $BCl_3$ and HF exposures were held at 500 and 2800 mTorr s, respectively.

FIG. 23 displays the W etch rate vs. $O_2$/$O_3$ exposure during the ABC reaction sequence at 207° C. The pressure of the $O_2$/$O_3$ exposure was 70 mTorr for the different exposure times of 15, 30, 45, and 60 s. HF and $BCl_3$ exposures were held constant at 2800 and 500 mTorr s, respectively. The HF and $BCl_3$ pressures were 535 and 60 mTorr, respectively, during these exposures. FIG. 23 shows that the W etch rate increases with $O_2$/$O_3$ exposure and reaches a maximum etch rate of 2.45 Å/cycle at an $O_2$/$O_3$ exposure of 3150 mTorr s. The line fitting the data points is meant to guide the eye.

Figure 24A:
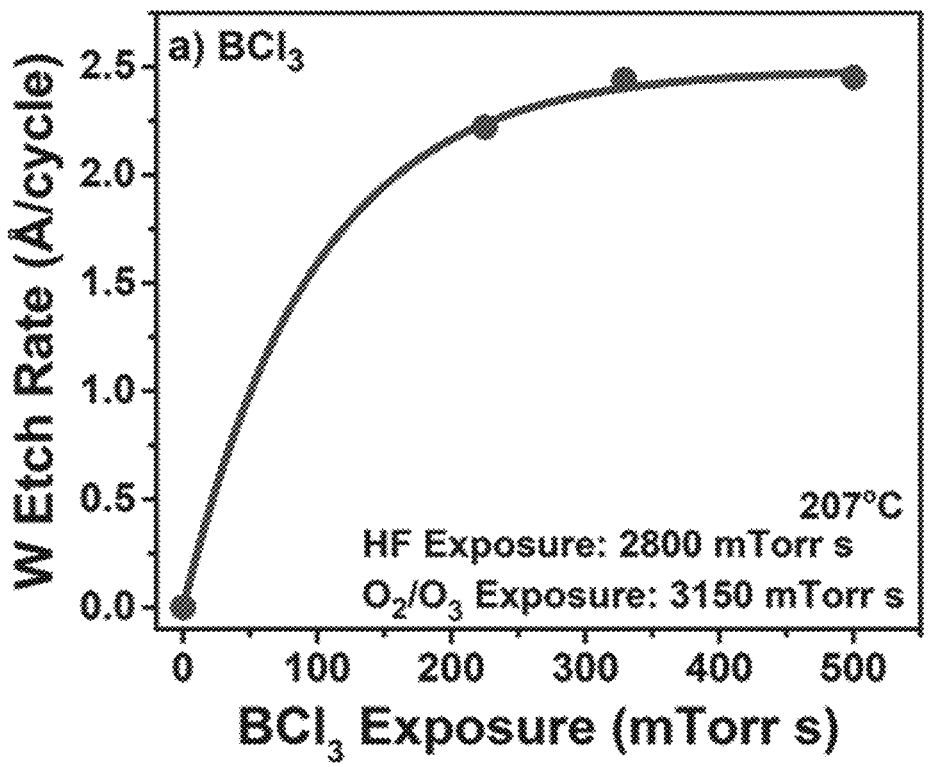
FIGS. 24A-24B are graphs showing W etch rate vs. reactant exposure during W ALE.
Figure 24B:
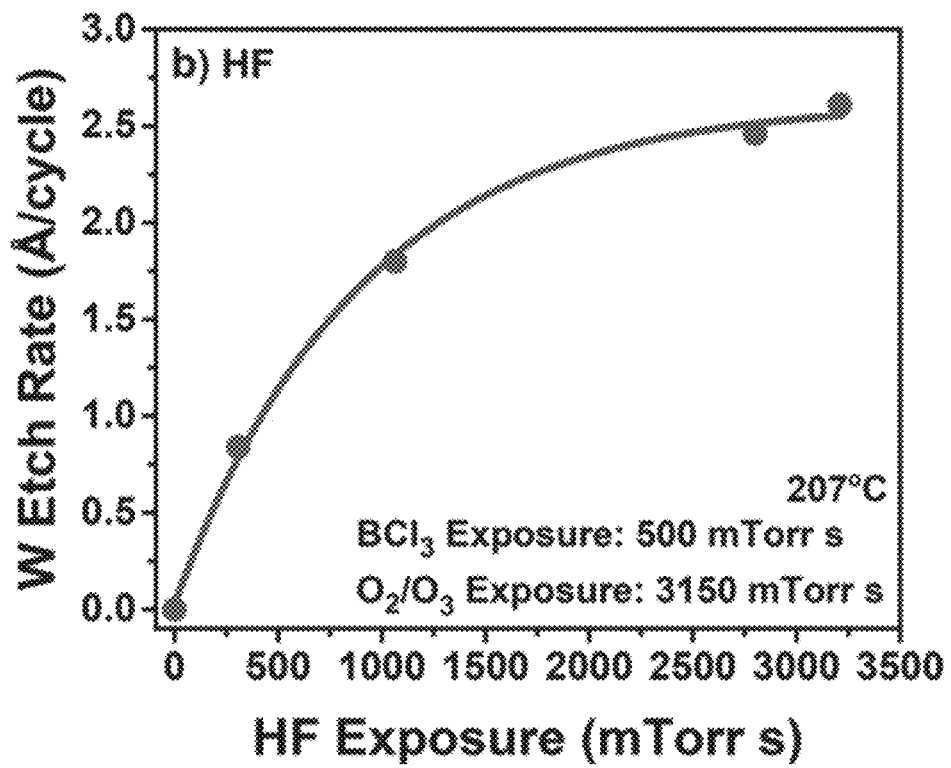

Results for the W etch rate vs. $BCl_3$ or HF exposure during W ALE at 207° C. are shown in FIGS. 24A and 24B, respectively. These measurements were performed by varying one reactant exposure and holding the other two reactant exposures constant. $BCl_3$ and HF were dosed into a stream of UHP $N_2$ that was at a pressure of 1180 mTorr. A purge of 130 s was employed after each reactant exposure. The $O_2$/$O_3$ exposure was 3150 mTorr s conducted at an $O_2$/$O_3$ pressure of 70 mTorr. A purge of 60 s was used after each $O_2$/$O_3$ exposure. FIG. 24A shows the results for varying the $BCl_3$ exposure while holding the HF and $O_2$/$O_3$ exposures constant at 2800 and 3150 mTorr s, respectively. The $BCl_3$ exposures were varied from 0 to 500 mTorr s. The $BCl_3$ exposure converts the $WO_3$ surface to a $B_2O_3$ surface layer. The $B_2O_3$ surface layer is then spontaneously etched by HF. The W etch rate increases rapidly with $BCl_3$ exposure. With a $BCl_3$ exposure of 329 mTorr s, the W etch rate reaches the self-limiting W etch rate of 2.45 Å/cycle. FIG. 24B shows the results for varying the HF exposure while holding the $BCl_3$ and $O_2$/$O_3$ exposures constant at 500 and 3150 mTorr s, respectively. Higher HF exposures progressively remove the $B_2O_3$ surface layer as volatile $BF_3$ and $H_2O$. With HF exposures of 2800 mTorr s, the W etch rate reaches the self-limiting W etch rate of 2.45 Å/cycle.

Additional experiments examined the oxidation of the W ALD films by successive $O_2$/$O_3$ exposures at 207° C. The $O_2$/$O_3$ exposures were 3150 mTorr s resulting from an $O_2$/$O_3$ pressure of 70 mTorr for 45 s. This is the same $O_2$/$O_3$ exposure that was employed in the W ALE experiments. The W ALD films had been exposed to atmosphere prior to loading into the reactor. The $WO_3$ thickness on the W ALD film was then measured by SE after each $O_2$/$O_3$ exposure. The $WO_3$ thickness vs. number of $O_2$/$O_3$ exposures is displayed in FIG. 25.

Figure 25:
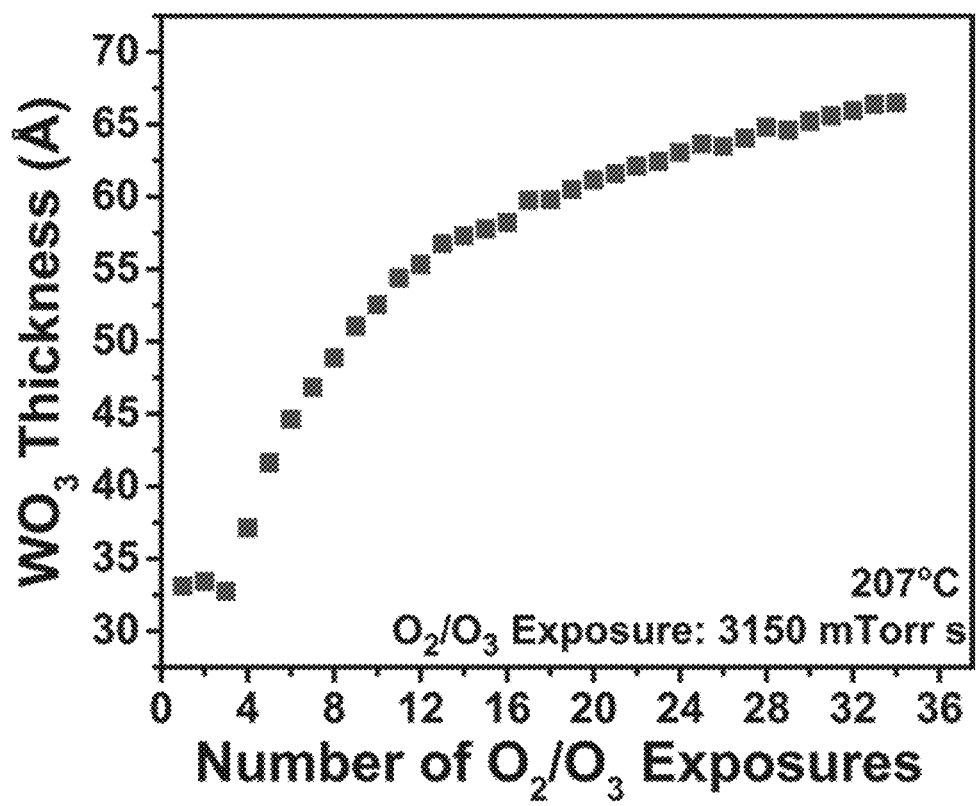
FIG. 25 is a graph showing $WO_3$ thickness vs. number of $O_2/O_3$ exposures for initial W ALD film. Each $O_2/O_3$ exposure was 70 mTorr for 45 s.

The initial $WO_3$ thickness in FIG. 25 is ~33 Å. This thickness is close to the native oxide thicknesses on tungsten that have been measured earlier with XPS and XRR analysis. The $WO_3$ thickness is nearly constant at ~33 Å after the first three $O_2/O_3$ exposures. This constant oxide thickness may be related to the $O_2/O_3$ exposure cleaning residual carbon from the surface. FIG. 25 then shows that the $WO_3$ thickness increases consistently after the third $O_2/O_3$ exposure. However, the increase is progressively reduced after each $O_2/O_3$ exposure. This behavior is suggestive of diffusion limited oxidation when the surface oxide acts as a barrier for oxidation of the underlying W metal. Similar behavior is also observed for the diffusion-limited oxidation of silicon described by the Deal-Grove model. The $WO_3$ thickness is ~66 Å after 34 $O_2/O_3$ exposures. XPS analysis of the $WO_3$ film produced by these $O_2/O_3$ exposures was consistent with stoichiometric $WO_3$ with W in the 6+ oxidation state.

The larger $WO_3$ thicknesses produced by greater number of sequential $O_2/O_3$ exposures may lead to W etch rates that are higher after larger $O_2/O_3$ exposures. However, FIG. 25 shows that the W etch rate is self-limiting vs. $O_2/O_3$ exposure. This behavior suggests that the W ALE is self-limiting because of the self-limiting $BCl_3$ and HF reactions. Larger $O_2/O_3$ exposures may lead to larger $WO_3$ film thicknesses. However, the $WO_3$ removal is still limited by the self-limiting $BCl_3$ and HF reactions. The $BCl_3$ and HF reactions may only remove a fraction of the $WO_3$ film. After partial removal of the $WO_3$ film, the next $O_2/O_3$ exposure would then reestablish a larger $WO_3$ film thickness that is consistent with the $O_2/O_3$ exposure.

Additional experiments were performed at 207° C. by varying the $O_2/O_3$ exposure times with an $O_2/O_3$ pressure of 70 mTorr under self-limiting conditions for the $BCl_3$ and HF reactions. $O_2/O_3$ exposure times of 45 and 60 s both produced W ALE etch rates of 2.45 Å/cycle. However, the $WO_3$ film thickness was ~20 Å for the 45 s $O_2/O_3$ exposures (3150 mTorr s) and ~30 Å for the 60 s $O_2/O_3$ exposures (4200 mTorr s) after >20 reaction cycles. The consequence of larger $O_2/O_3$ exposure times at constant $O_2/O_3$ pressures is thicker $WO_3$ thicknesses during W ALE. However, the W ALE etch rates remain the same. These results argue that W ALE is self-limiting because of the self-limiting $BCl_3$ and HF reactions.

Figure 26A:
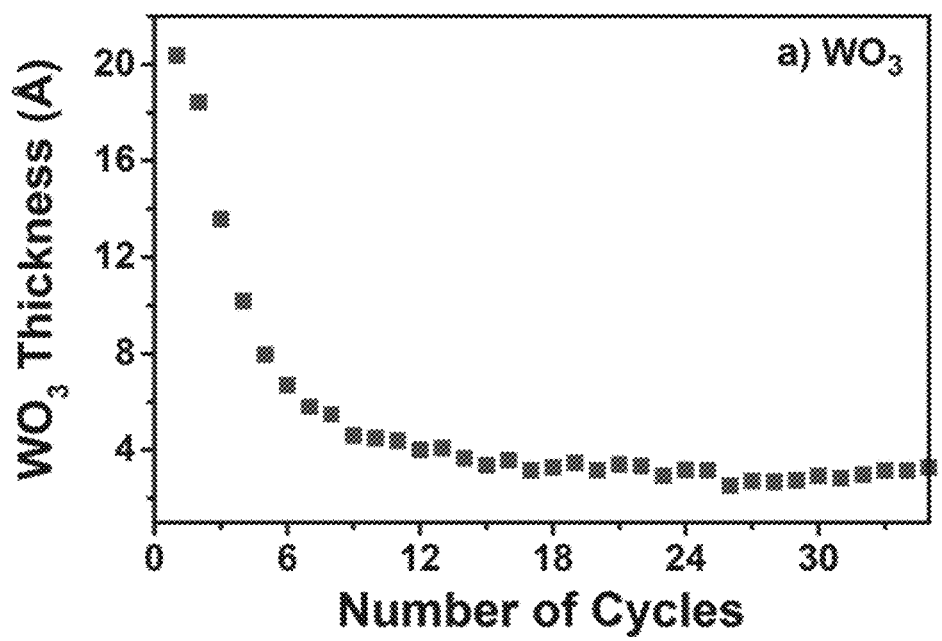
FIGS. 26A-26B are graphs showing $WO_3$ removal after W ALE using $BCl_3$ and HF as reactants.

FIG. 21A shows that the $WO_3$ thickness is reduced to a thickness of ~20 Å after 60 half-cycles during W ALE with an $O_2/O_3$ pressure of 70 mTorr and $O_2/O_3$ exposure time of 45 s under self-limiting conditions for the $BCl_3$ and HF reactions. Removal of this $WO_3$ layer on W may be important for applications where no oxide is desired for proper device function. This $WO_3$ layer can be removed by stopping the $O_2/O_3$ exposures and utilizing an AB reaction sequence with $BCl_3$ and HF exposures. FIG. 26A displays the removal of the $WO_3$ layer after W ALE vs. the number of $BCl_3$/HF reaction cycles using the self-limiting reaction conditions for $WO_3$ ALE at 207° C. The $WO_3$ layer thickness is reduced in thickness from 20 Å to a limiting thickness of ~3 Å after >12 reaction cycles.

Figure 26B:
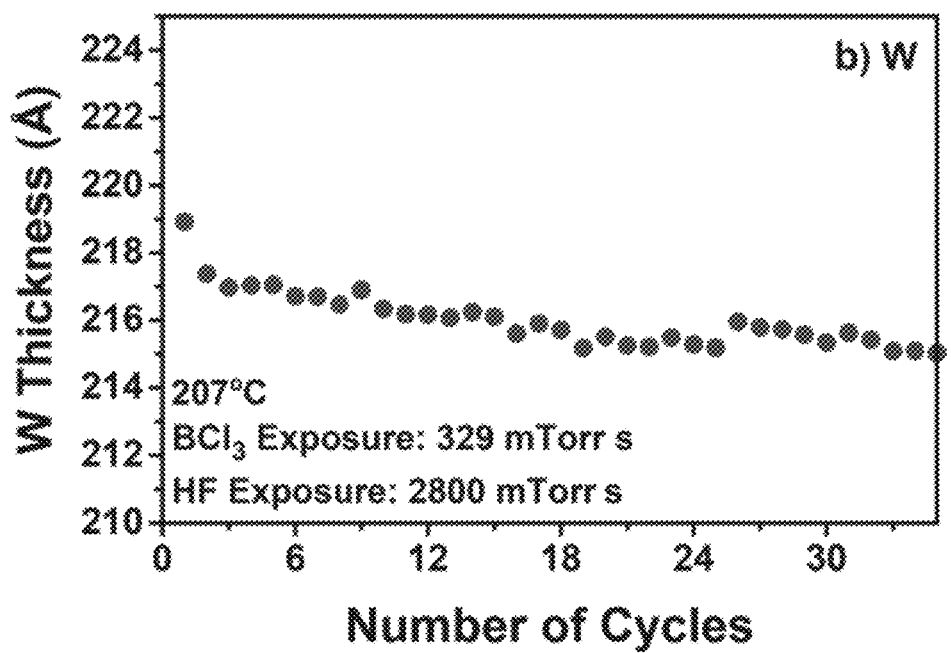

The corresponding W film thickness during the removal of the $WO_3$ layer is shown in FIG. 26B. While the $WO_3$ layer is removed during the AB reaction sequence, the W film thickness is nearly constant. The initial W film thickness is ~218 Å. The W film thickness reaches 215-216 Å after >12 reaction cycles. These results indicate that the $WO_3$ layer on W can be removed with almost no effect on the W thickness. There are also alternative methods to remove the $WO_3$ layer based on hydrogen reduction using $H_2$ or $H_2$ plasma exposures.

The self-limiting conditions for the $BCl_3$ and HF exposures during $WO_3$ ALE at 207° C. were 325 and 200 mTorr s, respectively. In comparison, the self-limiting conditions for the $O_2/O_3$, $BCl_3$, and HF exposures during W ALE at 207° C. were 3150, 325, and 2800 mTorr s, respectively. The self-limiting conditions for the HF exposure are very different for $WO_3$ and W ALE. The inclusion of the $O_2/O_3$ exposure in the ABC reaction sequence for W ALE leads to a much larger selflimiting HF exposure. The chamber walls are coated with $Al_2O_3$ ALD, and HF is known to adsorb on $Al_2O_3$ at the chamber wall temperature of 170° C. The $O_2/O_3$ exposure may remove HF from the chamber walls. Larger HF exposures may then be required during the subsequent $BCl_3$/HF reaction to replace the adsorbed HF and obtain self-limiting behavior.

Example 7: Extension to Additional Materials

The "conversion fluorination" and "oxidation-conversion-fluorination" mechanisms can be useful for the ALE of a variety of additional metal materials. These mechanisms may prove to be valuable because some metal materials cannot be etched using the fluorination and ligand-exchange mechanism. Fluorination of many metal materials is not thermodynamically favorable with HF. However, stronger fluorination reactants, like $SF_4$ and $XeF_2$, can lead to volatile metal fluorides and spontaneous etching. The highly exothermic reaction of stronger fluorination reagents with metal materials can also lead to fluoride layers too thick for ALE. Some metal materials are also difficult to fluorinate because they do not have stable fluorides in the same oxidation state as the initial metal material. Other metal materials can be fluorinated but do not easily yield volatile products during the ligand-exchange reaction.

$BCl_3$ is important for the conversion of many initial metal oxides to $B_2O_3$ because $B_2O_3$ is a stable metal oxide and many metals have volatile chlorides or oxychlorides. Metals with volatile chlorides or oxychlorides include W, V, Nb, Ta, Cr, Mo, Fe, Au, Ga, Ge, Sn, As, Sb, Zr and Hf. The spontaneous etching of $B_2O_3$ by HF also plays a key role in the new conversion etching mechanisms. HF can spontaneously etch $B_2O_3$. However, HF cannot spontaneously etch many other metal oxides. Consequently, if the initial metal oxide can be converted to $B_2O_3$, then HF can spontaneously etch $B_2O_3$ and the underlying initial metal oxide will serve as an etch stop.

Table 2 explores the thermochemistry of a variety of conversion reactions for various metal oxides. Most of these metal oxides will have difficulty achieving self-limiting ALE using fluorination and ligand-exchange reactions. The reasons for the difficulty include: (1) formation of volatile fluorides that lead to spontaneous etching ($WO_3$, $MoO_3$, $VO_2$, $V_2O_5$, $Ta_2O_5$, $GeO_2$, $As_2O_3$, $Au_2O_3$, $SbO_2$, $Sb_2O_3$, and $NbO_2$); (2) lack of volatile products after ligand-exchange reaction with various metal precursors ($Fe_2O_3$); and (3) absence of a stable fluoride with the same oxidation state as the initial metal oxide ($CrO_3$). All of these metal oxides have volatile chlorides or oxychlorides and should be converted to $B_2O_3$ using $BCl_3$ based on thermochemical calculations. $SnO_2$, $Ga_2O_3$, $ZrO_2$, and $HfO_2$ ALE are possible using fluorination and ligand-exchange reactions. These metal oxides are included in Table 2 because they have volatile chlorides or oxychlorides and could be etched using the "conversion-fluorination" mechanism as an alternative.

The thermochemistry of most of these reactions in Table 2 is favorable as measured by the standard free energy changes. The examples in Table 2 use either $BCl_3$ or $B(CH_3)_3$ for the conversion reaction to form $B_2O_3$. The choice of $BCl_3$ or $B(CH_3)_3$ depends on the volatility of the reaction products. In addition, the ligand on the boron center can also lead to selective ALE. The thermochemical calculations reveal that $Ga_2O_3$ cannot be converted to $B_2O_3$ using $B(CH_3)_3$. Consequently, $B(CH_3)_3$ could be used to etch $In_2O_3$, $GeO_2$, $As_2O_3$, and $SnO_2$ without etching $Ga_2O_3$.

The conversion of metal oxides to other metal oxides besides $B_2O_3$ is also possible. One possibility is the conversion of metal oxides to $TiO_2$ using $TiCl_4$. Fluorination of $TiO_2$ using HF exposures would then spontaneously etch $TiO_2$ by producing volatile $TiF_4$ and $H_2O$ reaction products. $TiCl_4$ may not be as useful as $BCl_3$ for conversion etch. The thermochemistry of conversion of metal oxides to $TiO_2$ using $TiCl_4$ is not as favorable as the thermochemistry of conversion of metal oxides to $B_2O_3$ using $BCl_3$. However, the conversion of the surface of a metal oxide to a $TiO_2$ surface layer may be useful for device applications to avoid a $TiO_2$ ALD processing step.

TABLE 2

Thermochemistry of a Variety of Conversion Reactions for Various Metal Oxides

| | $\Delta G°$ at 150° C. (kcal) |
|---|---|
| $BCl_3$ Conversion Reactions | |
| $As_2O_3 + 2BCl_3$ (g) → $B_2O_3 + 2AsCl_3$ (g) | −81.3 |
| $Au_2O_3 + 2BCl_3$ (g) → $B_2O_3 + 2AuCl_3$ (g) | −134.5 |
| $CrO_3 + 2/3 \, BCl_3$ (g) → $1/3 \, B_2O_3 + CrO_2Cl_2$ (g) | −93.7 |
| $Fe_2O_3 + 2BCl_3$ (g) → $B_2O_3 + 2FeCl_3$ (g) | −42.3 |
| $Ga_2O_3 + 2BCl_3$ (g) → $B_2O_3 + 2GaCl_3$ (g) | −61.6 |
| $GeO_2 + 4/3 \, BCl_3$ (g) → $2/3 \, B_2O_3 + GeCl_4$ (g) | −76.7 |
| $HfO_2 + 4/3 \, BCl_3$ (g) → $2/3 \, B_2O_3 + HfCl_4$ (g) | −15.6 |
| $MoO_3 + 2/3 \, BCl_3$ (g) → $1/3 \, B_2O_3 + MoO_2Cl_2$ (g) | −19.1 |
| $NbO_2 + 4/3 \, BCl_3$ (g) → $2/3 \, B_2O_3 + NbCl_4$ (g) | −13.6 |
| $Sb_2O_3 + 2BCl_3$ (g) → $B_2O_3 + 2SbCl_3$ (g) | −93.6 |
| $SnO_2 + 4/3 \, BCl_3$ (g) → $2/3 \, B_2O_3 + SnCl_4$ (g) | −47.5 |
| $Ta_2O_5 + 10/3 \, BCl_3$ (g) → $5/3 \, B_2O_3 + 2TaCl_5$ (g) | −42.8 |
| $VO_2 + 4/3 \, BCl_3$ (g) → $2/3 \, B_2O_3 + VCl_4$ (g) | −26.0 |
| $V_2O_5 + 2BCl_3$ (g) → $B_2O_3 + 2VOCl_3$ (g) | −67.1 |
| $ZrO_2 + 4/3 \, BCl_3$ (g) → $2/3 \, B_2O_3 + ZrCl_4$ (g) | −15.9 |
| $TiCl_4$ Conversion Reactions | |
| $As_2O_3 + 3/2 \, TiCl_3$ (g) → $3/2 \, TiO_2 + 2AsCl_3$ (g) | −41.7 |
| $CrO_3 + 1/2 \, TiCl_3$ (g) → $1/2 \, TiO_2 + CrO_2Cl_2$ (g) | −18.0 |
| $Fe_2O_3 + 3/2 \, TiCl_3$ (g) → $3/2 \, TiO_2 + 2FeCl_3$ (g) | −2.7 |
| $Ga_2O_3 + 3/2 \, TiCl_3$ (g) → $3/2 \, TiO_2 + 2GaCl_3$ (g) | −22.0 |
| $GeO_2 + TiCl_4$ (g) → $TiO_2 + GeCl_4$ (g) | −24.7 |
| $MoO_3 + 1/2 \, TiCl_3$ (g) → $1/2 \, TiO_2 + MoO_2Cl_2$ (g) | −5.9 |
| $Sb_2O_3 + 3/2 \, TiCl_3$ (g) → $3/2 \, TiO_2 + 2SbCl_3$ (g) | −54.0 |
| $SnO_2 + TiCl_4$ (g) → $TiO_2 + SnCl_4$ (g) | −21.1 |
| $B(CH_3)_3$ Conversion Reactions | |
| $As_2O_3 + 2B(CH_3)_3$ (g) → $B_2O_3 + 2As(CH_3)_3$ (g) | −83.0 |
| $Ga_2O_3 + 2B(CH_3)_3$ (g) → $B_2O_3 + 2Ga(CH_3)_3$ (g) | +34.1 |
| $GeO_2 + 4/3 \, B(CH_3)_3$ (g) → $2/3 \, B_2O_3 + Ge(CH_3)_4$ (g) | −45.6 |
| $In_2O_3 + 2B(CH_3)_3$ (g) → $B_2O_3 + 2In(CH_3)_3$ (g) | −127.3 |
| $SnO_2 + 4/3 \, B(CH_3)_3$ (g) → $2/3 \, B_2O_3 + Sn(CH_3)_4$ (g) | −26.8 |

The disclosures of each and every patent, patent application, and publication cited herein are hereby incorporated herein by reference in their entirety. While this invention has been disclosed with reference to specific embodiments, it is apparent that other embodiments and variations of this invention can be devised by others skilled in the art without departing from the true spirit and scope of the invention. The appended claims are intended to be construed to include all such embodiments and equivalent variations

What is claimed is:

1. A method of promoting atomic layer etching (ALE) on a solid substrate comprising a first metal compound, the method comprising:
    (a) contacting at least a portion of the surface of the solid substrate with an oxidant, whereby a first metal oxide is formed on the portion of surface of the solid substrate contacted with the oxidant; and
    (b) contacting at least a portion of the surface of the first metal oxide with a fluorinating agent, whereby a volatile metal fluoride is formed;
    whereby ALE of the solid substrate is promoted.

2. The method of claim 1, wherein the first metal compound comprises at least one selected from the group consisting of metal boride, metal carbide, metal silicide, metal germanide, metal nitride, metal phosphide, metal arsenide, metal antimonide, metal sulfide, metal selenide, metal telluride, elemental metal, metal alloy, and hybrid organic-inorganic material.

3. The method of claim 1, wherein the first metal compound is capable of forming a volatile metal fluoride.

4. The method of claim 3, wherein the first metal fluoride has a melting point of less than 200° C. at 1 atm pressure.

5. The method of claim 1, wherein the first metal compound comprises at least one species selected from the group consisting of Ti, Ta, Nb, V, W, Mo, Ir, Ru, Rh, Re, Au, Cr, Pt, B, Si, Ge, As, Sb, and Te.

6. The method of claim 1, wherein the oxidant is at least one gaseous oxidant selected from the group consisting of $O_2$, $H_2O_2$, $O_3$, oxygen plasma, reactive oxygen radical species, $NO_2$ plasma, $N_2O$ plasma, NO plasma, $HNO_3$ plasma, and $SO_2$ plasma.

7. The method of claim 1, wherein the fluorinating agent is at least one gaseous fluorinating agent selected from the group consisting of HF, $SF_4$, $XeF_2$, $F_2$, and $SF_6$ plasma.

8. The method of claim 1, wherein steps (a)-(b) are repeated one or more times, and wherein each repetition of steps (a)-(b) etches the solid substrate at a rate of about 0.1 Å to about 3.0 Å per cycle of steps (a)-(b).

9. The method of claim 1, wherein the method is used for at least one process selected from patterning a surface of the substrate, cleaning a surface of the substrate, creating pores in a surface of the substrate, enlarging pores in a porous surface of the substrate, smoothing a surface of the substrate, removing defects from a surface of the substrate, removing damaged surface layers of the substrate, and removing unwanted clusters or islands from a surface of the substrate.

10. The method of claim 1, wherein a film having a thickness greater than about 10 nm is etched by performing steps (a)-(b) one or more times, thereby generating a substrate film having a thickness of less than about 10 nm.

11. A method of promoting atomic layer etching (ALE) on a solid substrate comprising a first metal compound, the method comprising:
    (a) contacting at least a portion of the surface of the solid substrate with an oxidant, whereby a first metal oxide is formed on the portion of surface of the solid substrate contacted with the oxidant;
    (b) contacting at least a portion of the surface of the first metal oxide with a second metal compound, whereby a second metal oxide is formed on the portion of surface of the first metal oxide contacted with the second metal compound and whereby a volatile first metal species is further formed; and
    (c) contacting at least a portion of the surface of the second metal oxide with a fluorinating agent, whereby a volatile metal fluoride is formed;
    whereby ALE of the solid substrate is promoted.

12. The method of claim 11, wherein the first metal compound comprises at least one selected from the group consisting of metal boride, metal carbide, metal silicide, metal germanide, metal nitride, metal phosphide, metal arsenide, metal antimonide, metal sulfide, metal selenide, metal telluride, an elemental metal, metal alloy, and hybrid organic-inorganic material.

13. The method of claim 11, wherein the first metal compound comprises a metal species capable of forming at least one selected from the group consisting of a volatile metal oxyfluoride, a volatile metal chloride, a volatile metal oxychloride, a volatile metal bromide, a volatile oxybromide, a volatile metal iodide, a volatile oxyiodide, and a volatile metal organic compound.

14. The method of claim 11, wherein the first metal compound comprises a metal species capable of forming at least one second metal species selected from the group consisting of a metal oxyfluoride, metal chloride, metal oxychloride, metal bromide, metal oxybromide, metal iodide, and metal oxyiodide, wherein the first metal species has a melting point of less than 200° C. at 1 atm pressure.

15. The method of claim 11, wherein the second metal compound comprises a metal species capable of forming a stable metal oxide species on the surface of the solid substrate and at least one selected from the group consisting of a volatile metal fluoride, volatile metal oxyfluoride, volatile metal chloride, volatile metal oxychloride, volatile metal bromide, volatile metal oxybromide, volatile metal iodide, and volatile metal oxyiodide.

16. The method of claim 11, wherein the second metal compound comprises a metal species capable of forming at least one second metal species selected from the group consisting of a metal fluoride, metal oxyfluoride, metal chloride, metal oxychloride, metal bromide, metal oxybromide, metal iodide, and metal oxyiodide, wherein the second metal species has a melting point of less than 200° C. at 1 atm pressure.

17. The method of claim 11, wherein the first metal compound comprises at least one species selected from the group consisting of Al, Hf, Zr, Fe, Ni, Co, Mn, Mg, Rh, Ga, In, Zn, Pb, Cu, Cd, Hg, Ca, Li, Ag, Sn, Y, Ti, Ta, Nb, V, W, Mo, Ir, Ru, Rh, Re, Au, Cr, Pt, B, Si, Ge, As, Sb, and Te.

18. The method of claim 11, wherein the second metal compound is at least one selected from $BCl_3$, $B(CH_3)_3$, $BBr_3$, $BI_3$, and $TiCl_4$.

19. The method of claim 11, wherein the second metal oxide is $B_2O_3$ or $TiO_2$.

20. The method of claim 11, wherein the oxidant is at least one gaseous oxidant selected from the group consisting of $O_2$, $H_2O_2$, $O_3$, oxygen plasma, reactive oxygen radical species, $NO_2$ plasma, $N_2O$ plasma, NO plasma, $HNO_3$ plasma, and $SO_2$ plasma.

21. The method of claim 11, wherein the fluorinating agent is at least one gaseous fluorinating agent selected from the group consisting of HF, $SF_4$, $XeF_2$, $F_2$, and $SF_6$ plasma.

22. The method of claim 11, wherein the wherein steps (a)-(c) are repeated one or more times, and wherein each repetition of steps (a)-(c) etches the solid substrate at a rate of about 0.1 Å to about 3.0 Å per cycle of steps (a)-(c).

23. The method of claim 11, wherein the method is used for at least one process selected from patterning a surface of the substrate, cleaning a surface of the substrate, creating pores in a surface of the substrate, enlarging pores in a porous surface of the substrate, smoothing a surface of the substrate, removing defects from a surface of the substrate, removing damaged surface layers of the substrate, and removing unwanted clusters or islands from a surface of the substrate.

24. The method of claim 11, wherein a film having a thickness greater than about 10 nm is etched by performing steps (a)-(c) one or more times, thereby generating a substrate film having a thickness of less than about 10 nm.

* * * * *